US008018053B2

(12) United States Patent
Nathanson et al.

(10) Patent No.: US 8,018,053 B2
(45) Date of Patent: Sep. 13, 2011

(54) HEAT TRANSFER DEVICE

(75) Inventors: Harvey C. Nathanson, Pittsburgh, PA (US); Robert M. Young, Ellicott City, MD (US); Joseph T. Smith, Columbia, MD (US); Robert S. Howell, Silver Spring, MD (US); Archer S. Mitchell, Silver Spring, MD (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 730 days.

(21) Appl. No.: 12/023,831

(22) Filed: Jan. 31, 2008

(65) Prior Publication Data

US 2009/0194870 A1 Aug. 6, 2009

(51) Int. Cl.
*H01L 23/34* (2006.01)
*H01L 35/00* (2006.01)

(52) U.S. Cl. .................. 257/717; 257/E23.08; 257/712; 257/713; 257/720; 257/675; 327/512; 136/201; 136/205; 136/258; 136/203

(58) Field of Classification Search .................. 257/717, 257/E23.08, 712, 713, 720, 675, 728; 327/512; 136/201, 205, 258, 203
See application file for complete search history.

(56) References Cited

U.S. PATENT DOCUMENTS

| | | | |
|---|---|---|---|
| 5,777,427 A * | 7/1998 | Tanaka et al. .................. 313/309 |
| 6,384,312 B1 | 5/2002 | Ghoshal et al. | |
| 6,403,874 B1 | 6/2002 | Shakouri et al. | |
| 6,552,256 B2 | 4/2003 | Shakouri et al. | |
| 6,608,250 B2 * | 8/2003 | Ghoshal .................. 136/201 |
| 6,613,602 B2 * | 9/2003 | Cooper et al. .................. 438/54 |
| 6,740,600 B2 * | 5/2004 | Ghoshal et al. ............... 438/754 |
| 6,790,744 B2 | 9/2004 | Chen et al. | |
| 7,164,077 B2 | 1/2007 | Venkatasubramanian | |
| 7,235,735 B2 | 6/2007 | Venkatasubramanian et al. | |
| 7,498,507 B2 * | 3/2009 | Weaver et al. ................ 136/205 |
| 2003/0113950 A1 | 6/2003 | Cooper et al. | |
| 2004/0018729 A1 * | 1/2004 | Ghoshal et al. ............... 438/689 |
| 2004/0195934 A1 | 10/2004 | Tanielian | |

(Continued)

FOREIGN PATENT DOCUMENTS

EP 0 706 196 A2 4/1996

(Continued)

OTHER PUBLICATIONS

K.P. Pipe, et al.; "Bias-dependent Peltier coefficient and internal cooling in bipolar devices"; The American Physical Society; 2002;pp. 125316-1 through 125316-11.

(Continued)

*Primary Examiner* — Alexander O Williams
(74) *Attorney, Agent, or Firm* — Tarolli, Sundheim, Covell & Tummino LLP

(57) ABSTRACT

One example discloses a heat transfer device that can comprise a semiconductor material having a first region and a second region. The first region and the second region are doped to propel a charged carrier from the first region to the second region. The heat transfer device can also comprise an array of pointed tips thermoelectrically communicating with the second region. A heat sink faces the array, and a vacuum tunneling region is formed between the pointed tips and the heat sink. The heat transfer device further can further comprise a power source for biasing the heat sink with respect to the first region. The first region defines an N-type semiconductor material and the second region defines a P-type semiconductor material.

39 Claims, 17 Drawing Sheets

U.S. PATENT DOCUMENTS

| | | |
|---|---|---|
| 2005/0016575 A1 | 1/2005 | Kumar et al. |
| 2005/0161072 A1 | 7/2005 | Esser et al. |
| 2007/0023077 A1 | 2/2007 | Tanielian |
| 2008/0017237 A1* | 1/2008 | Bray et al. .................. 136/224 |

FOREIGN PATENT DOCUMENTS

| | | |
|---|---|---|
| EP | 1340267 | 9/2003 |
| WO | WO 99/10695 | 3/1999 |
| WO | WO 01/39235 A2 | 5/2001 |

OTHER PUBLICATIONS

M.S. Tyagi, et al.; "Minority Carrier Recombination in Heavily-Doped Silicon"; Solid State Electronics; vol. 26; No. 6; pp. 577-597; 1983.

International Search Report for corresponding PCT/US2009/030630, mailed Feb. 4, 2010.

* cited by examiner

HEAT TRANSFER DEVICE

BACKGROUND

1. Field of the Invention

The disclosure generally relates to a method and system for cooling a heat source. More specifically, the disclosure relates to a method and system for reducing thermal energy of a heat source by transferring energy from the source through charged particles.

2. Description of Related Art

Cryogenic coolers are refrigerators capable of attaining a temperature below 200K (−73 C). Conventional cryogenic coolers are large, mechanical reverse heat engine devices. Examples of such coolers include Stirling, Pulse-Tube, Joule-Thomson, and reverse-Brayton mechanical coolers. Such coolers have many moving parts such as valves, seals, compressors and expanders. Consequently, while conventional coolers provide efficient refrigeration, they have inadequate reliability and limited service life. They also suffer from high levels of vibration and cannot be used with sophisticated infrared (IR) sensors, master oscillators, or low noise amplifiers (LNAs) which require cryogenic system with little or no vibration. The large size of the conventional cryogenic systems also results in a prolonged cool down time which often requires excessive lift capability to meet the cool down requirements.

Conventional mechanical cryogenic coolers do not scale well into the 100 to 300 milliwatt cooling realm, and in the cooling of modern sensors and microcircuits the conventional coolers are many orders of magnitude larger in footprint or occupied volume than the integrated circuit (IC) being cooled. Indeed, some cryo-coolers are multistage devices that further complicate the issues of size, weight, reliability and cool-down time.

The thermoelectric effect (TE) is the direct conversion of temperature differences to electric voltage and vice versa. A thermoelectric device creates a voltage when it is supplied with different temperatures on each side thereof. Conversely, when a voltage is applied to the device, it creates a temperature difference. This effect can be used, for example, to generate electricity, measure temperature, and heat or cool objects.

The conversion of energy from thermal state to electrical state (the thermoelectric phenomenon) has been described in view of Seebeck effect, the Peltier effect and the Thomson effect. The Thomson effect occurs in a conductor when the ends of that conductor are at different temperatures and an electric current is flowing, generating a heating that is different than $I^2R$ heating, the difference being dependent on the magnitude and direction of the current, the temperature, and on the material. The Peltier effect describes the isothermal heat exchange that takes place at the junction of two different materials when an electrical current flows between them. The rate of development of heat is greater or less than that of $I^2R$ heating, the difference depending upon the direction and magnitude of the electric current, on the temperature, and on the two materials forming the junction. The Seebeck effect can be viewed as the sum of the Peltier and Thomson effects around a circuit loop.

The Peltier effect is caused by the fact that the electron's average energy varies from material to material. Thus, when a charged carrier such as an electron or a hole crosses from one material to another, the charged carrier compensates for the energy difference by exchanging heat with the surrounding lattice. The amount of heat exchanged for a given current I across a junction is determined by the Peltier coefficient. The Peltier coefficient is negative if heat is transported by the electrons and it is positive if heat is transported by holes.

Thus, when a semiconductor material is placed between a heat source and a heat sink, a favorable current flow through the semiconductor causes the heat to be extracted from the heat source and deposited on the heat sink. Applying these principles, conventional systems have been devised to provide solid state cooling, typically for electronic devices. However, conventional systems have been inefficient in their capacity to conduct heat. Accordingly, there is a need for an efficient solid state cooling system.

SUMMARY

In one embodiment, the disclosure relates a heat transfer device comprising: a semiconductor having a first region and a second region, the first region and the second region doped to propel a charged carrier from the first region to the second region; an array of pointed tips thermoelectrically communicating with the second region; a heat sink facing the array, a vacuum tunneling region formed between the pointed trips and the heat sink; and a power source for biasing the heat sink with respect to the first region; wherein the first region defines an N-type semiconductor and the second region defines a P-type semiconductor.

In another embodiment, the disclosure relates to a heat transfer device, comprising: a first semiconductor region; a second semiconductor region in contact with the first semiconductor region, the second semiconductor region having a plurality of pointed tips; a hot sink facing the plurality of pointed tips; a first power source for electrically biasing the first semiconductor region relative to the second semiconductor region; and a second power source for electrically biasing the first semiconductor region relative to the hot sink.

In still another embodiment, the disclosure relates to a heat transfer transistor comprising: a first semiconductor region of an N-doped material; a heat sink supplying a first current to the first semiconductor region; a second semiconductor region of a P-doped material, the second semiconductor region interposed between the first semiconductor region and the heat sink, the first semiconductor region thermoelectrically communicating with the second semiconductor region and having a pointed array; a vacuum region extending from the pointed array to the heat sink; and a controller for controlling the first current flow by biasing the second semiconductor region with respect to one of the heat sink or the first semiconductor region.

In still another embodiment, the disclosure relates to a method for cryogenically cooling a node, the method comprising: communicating the heat from the node to a semiconductor having an N-doped region and a P-doped region, the semiconductor including an array of pointed tips; positioning a heat sink adjacent the array; and biasing the semiconductor with respect to the heat sink to provide movement for a charged carrier from the N-doped region of the semiconductor to the heat sink.

BRIEF DESCRIPTION OF THE DRAWINGS

The representative embodiments of the disclosure will be described in relation with the following exemplary and non-limiting drawings in which.

DETAILED DESCRIPTION

In one embodiment, the disclosure relates to a novel combination of an electrical current flowing through a forward biased $n^{++}/p^+$ thin silicon junction, and having the current exit into vacuum by field effect emission at sharp $p^+$ silicon points. The sharp silicon point can have a short tip depletion distance less than the mean electron/phonon interaction length. In this manner, heat can be extracted efficiently from the silicon junction device causing a net refrigeration. According to this embodiment, the cryogenic temperatures of 60K or even lower can be attained in a single stage. The extracted heat can be released to the ambient without further energy expenditure.

The embodiments disclosed herein can be implemented in a very lightweight and thin refrigerator whose cooling power scales with its surface area. The refrigeration system can be entirely free of vibration and can define a solid state device with no moving parts. Moreover, because the refrigeration system does not have moving parts the refrigeration system is highly reliable.

The disclosed refrigeration system disclosed herein can provide a cool down time of less than 10 seconds. This refrigeration system can have applications in IR sensors for satellites, missile seekers and portable night vision equipment. The refrigeration system, can be used for portable miniature high temperature superconducting devices, e.g. a pocket SQUID sensor. The disclosed refrigeration system can be used to cool electronic equipment such as low noise amplifiers (LNAs) and oscillators where very low noise figures are desired. With its very small form and short cool down time, the disclosed embodiments can be readily applied in military arenas that hitherto have been unachievable.

Figure 1:
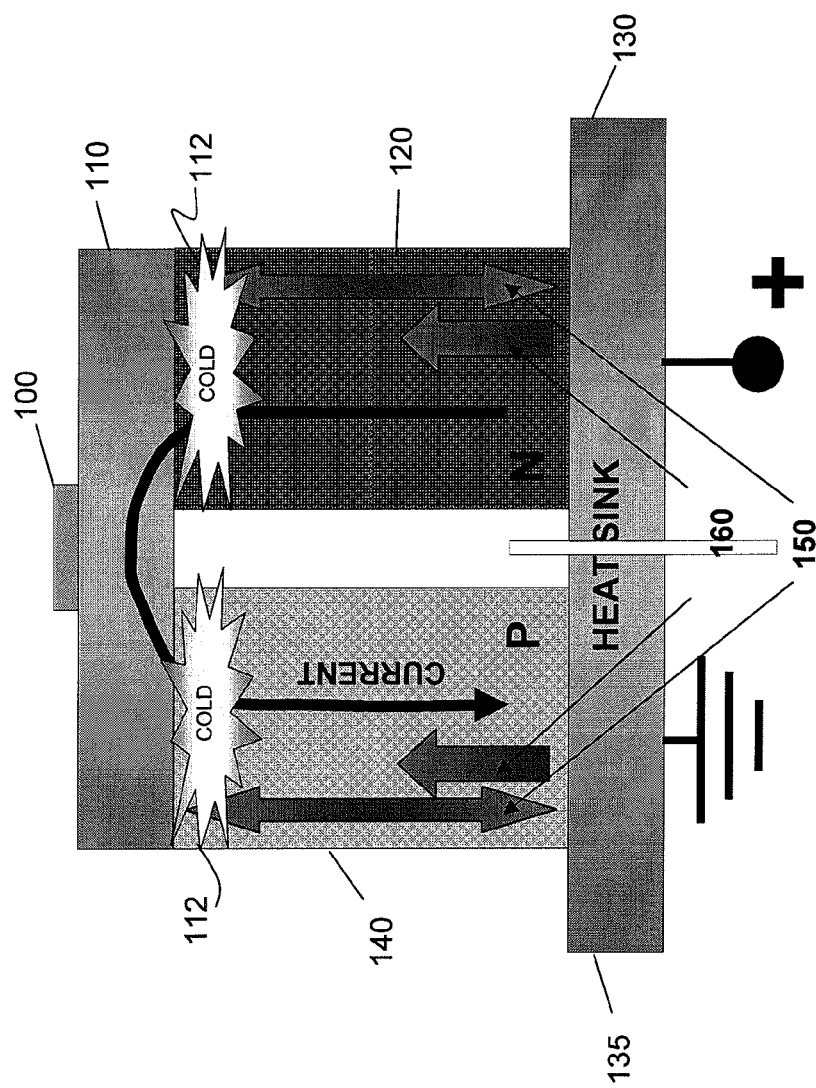
FIG. 1 is a schematic illustration of a conventional TE device.

FIG. 1 is a schematic illustration of a conventional TE device. More specifically, FIG. 1 shows a conventional bulk Seebeck effect TE device. The TE device of FIG. 1 includes cooling IR Sensor 100 in thermal communication with metal strap 110. Metal strap 110 is separated from heat sinks 130 and 135 by semiconductor P- and N-doped semiconductor regions 140 and 120, respectively. Heat sinks 135 is grounded. Heat sink 130 is coupled to a voltage source. Voltage flows from heat sink 135, through metal strap 110, to heat sink 130. Current flows from heat sink 130 to heat sink 135 as shown by the arrow in FIG. 1. Arrows 150 signify Ohmic heat generation. Arrows 160 signify heat leaks from the hot heat sink.

In cooling mode, current (travel of positive charge) flows counterclockwise, and the Seebeck effect, which occurs at the lightly-doped semiconductor or semi-metal junction, creates a cooling effect due to the entropy shift caused by the voltage difference across the junction. On the N-doped side 120, heat is carried away from the Ohmic (cold) junction 112 by the electrons which move in a direction opposite to the current flow. On the P-doped side, positively charged holes carry the heat away from the Ohmic (cold) junction 112. The metal strap 110 connects the two sides of the cold Ohmic junctions. Strap 110 provides a convenient platform for the load, in this case, IR sensor chip 100. The total Seebeck effect concerns the sum of the magnitudes of the P-doped and N-doped coefficients.

In a conventional TE cooler, the input current causes an Ohmic $I^2R$ heat generation in the thermoelectric cooler since the thermoelectric material is also unavoidably in the current path. Conventionally, a "figure-of-merit" value for Z determines the contribution of the $I^2R$ losses in the current path along with the Fourier thermal conduction paths for the ordinary TE; Z measures the lowest temperature capability for the ordinary TE, when the TE effect is overwhelmed by the $I^2R$ and thermal conduction terms. Thus, Z is a measure of the lowest temperature possible in a no load normal TE. Typical values of $Z \times T_{COOL}$ are known to essentially never exceed the value 1 in conventional TE devices, which leads to a $T_{HOT}/T_{COOL}$ which is rarely greater than 1.5 in commercial TEs.

Figure 2:
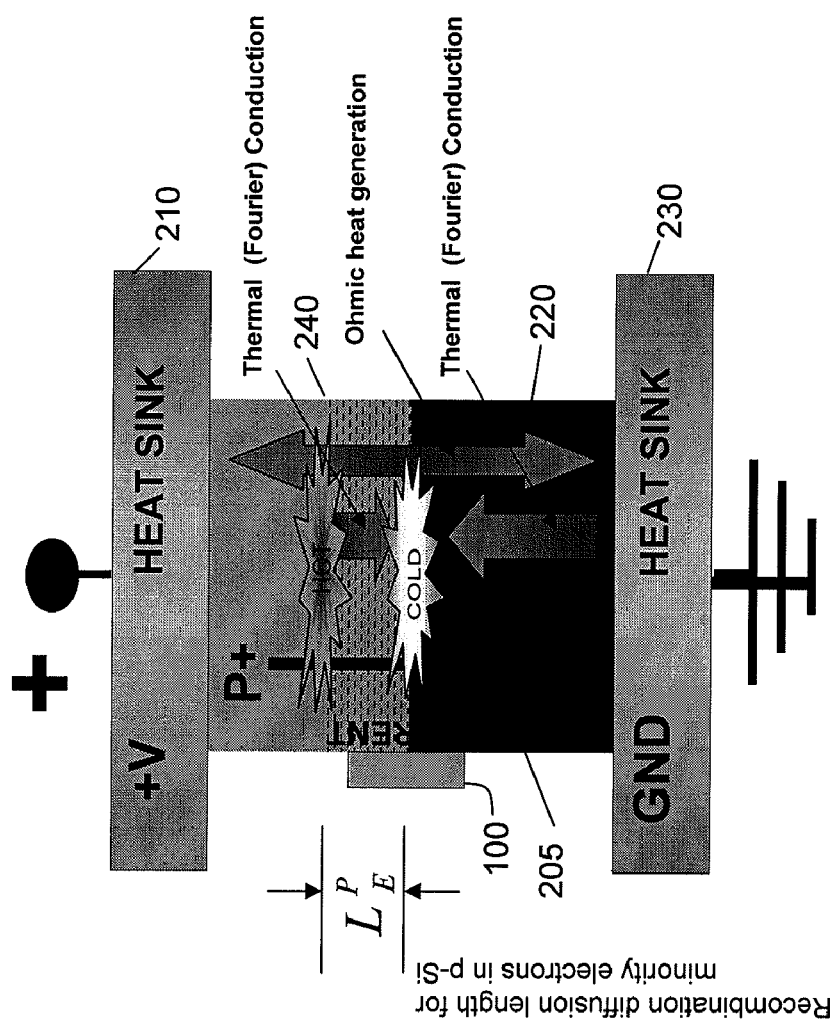
FIG. 2 shows another conventional cooling system.

FIG. 2 shows another conventional cooling system. Specifically, FIG. 2 shows a similar semiconductor junction with the metal strap of FIG. 1 removed such that the P 240 and N 220 sides are in direct contact. The doped sides of FIG. 2 are N++ and P+ silicon junction thermoelectric material. Two important differences are also present in FIG. 2 as compared to FIG. 1. First, the power supply circuit connections have been reversed, with the (positive) current direction now being from P 240 to N 220 as shown by arrow 205. Second, the doping levels in the semiconductor are different from that of FIG. 1. Large Seebeck coefficients exist for lightly doped semiconductors and ordinarily if the current direction is reversed in a TE cooler it generates heat at the junction (i.e., junction gets warmer instead of colder). However, in FIG. 2, the P and the N sides are heavily doped. The N layer is doped to around 1E19 $cm^{-3}$ and the P side is doped to 8E17 $cm^{-3}$. The Seebeck effect becomes insignificant and a new cooling mechanism comes into play. The actual heat lift is still largely limited by the Fourier thermal back conduction leakage, and the internal Ohmic generation.

In the embodiment of FIG. 2, the N-doped side's carriers are no longer moving in an appropriate direction to remove heat from heat sink 230 to heat sink 210. The electrical connection can be replaced with a material that is better optimized towards the minimization of the Ohmic/Heat Back Conduction (Fourier) terms, such as a pure metal like Aluminum. This is shown schematically in the inventive embodiment of FIG. 3 as a small optimized diameter wire connecting electrical ground to the now thinned n-doped semiconductor region.

Figure 3:
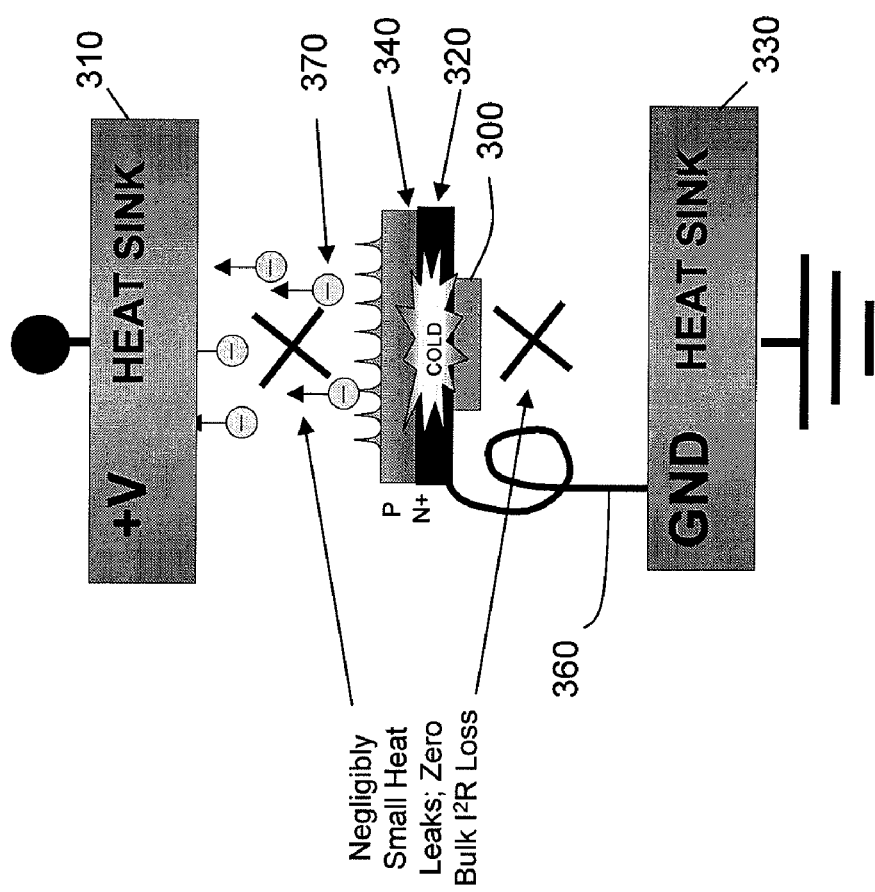
FIG. 3 schematically shows a point-cooling system according to an embodiment of the disclosure.

FIG. 3 schematically shows a point-cooling system according to an embodiment of the disclosure. The point-cooler of FIG. 3 removes P and N region power ($I^2R$) and reverses heat leakage paths. Although not shown, the system 300 of FIG. 3 is housed in a vacuum. Thus, the P-doped leg is replaced with vacuum (not shown) to provide electrical continuity by having the electrons emitted from the very thin P-doped region 340 through field emission points. Electron tunneling is shown by movement of current carriers 370 which carry heat away on P+ side to heat sink 310. Heat sink 330 is grounded. Heat sink 330 communicates with N-doped semiconductor junction through wire 360. This approach eliminates substantially all Fourier conduction losses and Ohmic generation from the P-side, resulting in a tremendous low temperature advantage when cast into an effective Seebeck coefficient ($\alpha$) and Figure Of Merit (Z) compared to conventional thermoelectrics, but at the price of a required voltage drop across the vacuum which extracts electrons by tunneling.

The Point-Cooler of FIG. 3 places a power load 300 on the anode side and adjacent N-doped region 320 hence impacts the thermodynamic efficiency of the Point Cooler according to the inventive embodiments. Low extraction voltages are favored in this embodiment.

Figure 4:
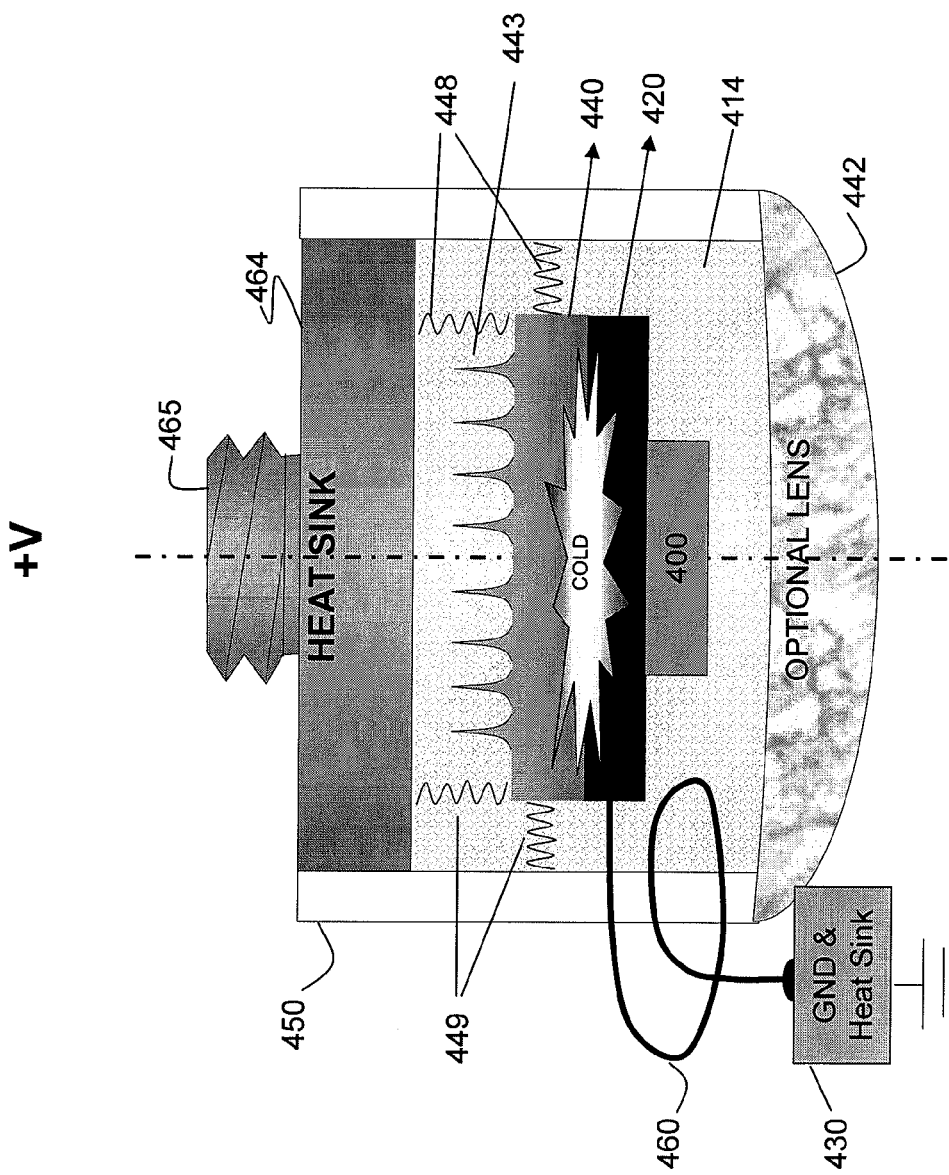
FIG. 4 schematically shows a Point-Cooling system according to one embodiment of the disclosure.

FIG. 4 schematically shows a Point-Cooling system according to one embodiment of the disclosure. The Point-Cooling system of FIG. 4 comprises optical lens 442, housing 450, grounded heat sink 430, wire 460, load 400, PN-Junction 420, 440, hanging wires 448, 449 and heat sink 464 with attachment bolt 465. The optical is optional and can belong, for example, to an IR sensor system.

Load 400 is in thermal communication with P-doped region 420. P-doped region 420 is connected to N-doped region 440 of the semiconductor. The junction between the P-doped region and the N-doped regions is the cold region as shown in FIG. 4. In addition, the N-doped region 420 is electrically grounded through wires 449. In accordance with an embodiment of the disclosure, the P-doped region 440 comprises pointed tips 443 formed as an array thereon. The pointed tips allow for efficient flow of electrons and the so-called electron tunneling effect. While not shown, the housing 450 is vacuumed. Wires 443 and 448 keep the semiconductor in place with respect to the housing 450.

By the virtue of the potential difference between heat sink 464 (which is positively charged) and ground 430, electrons flow from P-doped region 420 to N-doped region 440, through point array 443 and the vacuum region spanning between point array 443 and heat sink 464. Tunneling is well known to those skilled in the art. Bolt 465 provides for mechanical mounting and good heat transfer to the ambient.

The novel cooling system disclosed herein has many advantages. For example, the cooling systems according to the principles disclosed herein are capable of achieving cold temperatures of 60° K or even lower in a single stage fashion. The disclosed cooling systems are very lightweight. For example, a 5 gm. cooler can be used to cool a 1 $cm^2$ area. The disclosed cooling system are also very thin. In one embodiment, the disclosed cooling system is about 1 mm thick. The compact size of the disclosed cooling system avails it to applications that require Form Fit Function insertion ($F^3$ insertion) of a cold spot, where a hundred or thousand times larger cooler would otherwise be prohibitive.

The disclosed system is also substantially vibration-less which aids in minimizing noise and optical axis jitter in cooled optical systems (e.g., space sensors), LNAs and oscillators. Being so slight in mass, the cooler is also able to have a cool down time of about 10 to 20 seconds, compared to the ~8 minutes commonly specified for tactical mechanical cryogenic coolers. This opens up new applications which have been unachievable otherwise. With no moving parts the Point Cooler should be very reliable, having no mechanical parts that can wear out. The tunneling of P type points is also projected to be a significantly more reliable mechanism compared to metallic point tunneling.

It has been known that expected cooling of a forward biased PN junction is dictated approximately by:

$$P_{COOL} \sim (V_{B1} - V_J) \times J \text{ in watts/cm}^2 \qquad (1)$$

Where, $V_{B1}$ is the built in voltage of the junction, known to the art, and $V_J$ is the applied voltage. J is the current density flowing thru the junction at the voltage ($V_{B1} - V_J$). These expressions are all a strong and implicit function of the temperature of the device and since a wide range of temperatures are encountered when the device is cooled down from say 300K through 60K, and everything is varying with T, we use an expression which is equivalent to the above but more convenient and simpler to calculate temperature. Equivalently, the Cooling Thermo-power in a junction is given by:

$$= \left(\frac{k}{q}\right) \ln\left(\frac{J_o}{J}\right) [\text{volts/K}], \qquad (2)$$

$$\text{where } J_o = q D_E^P(T_{cool}) N_C(T_{cool}) / L_E^P(T_{cool})$$

Where $N_c$ is the density of states function for electrons in the N+ material; $D_E^P$ is the diffusion constant for electrons in the P material; and $L_E^P$ is the diffusion length of electrons in the p material.

It should be noted that in the silicon junction cooler, there is a small Seebeck effect above, but at the very high doping levels for both the N and P regions, the normal Seebeck effect is quite negligible. The dominate effect is at the junction, where each electron injected by the forward biased N++/P+ junction, carries (k/q)ln ($J_o$/J)T electron-volts of energy, or about 300 milli-electron-volts (meV) at 300K, and 100 meV at 100K.

Superficially, the disclosed Point Cooler might appear similar to Nottingham emission, but such conclusion is false. Inverse Nottingham Effect (INE) coolers achieve cooling by emission of electrons above the Fermi level into the vacuum. The conventional INE involves using a Double Barrier Resonant Tunneling (DBRT) section positioned between their flat (not pointed) surface and the vacuum which increase the electron emission and provide energy selectivity. Even with such DBRT sections fairly high electric fields are required unless the surface work function is made quite low.

In contrast, the disclosed embodiments provides a Point Cooler which require no thermal generation of electrons. In addition, unlike the DBRT system, the disclosed embodiments does not require hopping to provide the source of the minority carriers' inversion layer. In the embodiments disclosed herein, the electron injecting contact floods the sharp points with minority carriers.

In a preferred embodiment, the discharge device is constructed such that the p region thickness $W_P \ll L_e^P$. If the tip depletion region thickness $W_d \ll L_{phonon}$, then electrons leave carrying the original heat content taken remotely from the N+/P junction and inject this heat into the vacuum and ultimately the anode.

Thus, in contrast to conventional DBRT, the disclosed cooling occurs directly at the PN junction interface. Because the junction is heavily doped on the N+ side and much less doped on the P side, almost all of the current is carried by electrons so that the N+ region is cooled and the P side captures the removed heat. The heat is then carried by diffusing electron-hole pairs towards the points.

In one embodiment of the disclosure, excess electrons are removed without heating the lattice by: (1) keeping the holes from recombining (by making the P region much thinner than an electron diffusion length $L_E^P$ in the P material), and (2) keeping the electrons from losing energy to the lattice at the tip depletion region edge and/or during tunneling. It should be noted that the hole stays behind at the depletion region edge and just the electron reaches the tip. This mechanism cools the P region without a major reverse heat leakage path from the receiving anode heat sink back to the semiconductor.

Figure 5:
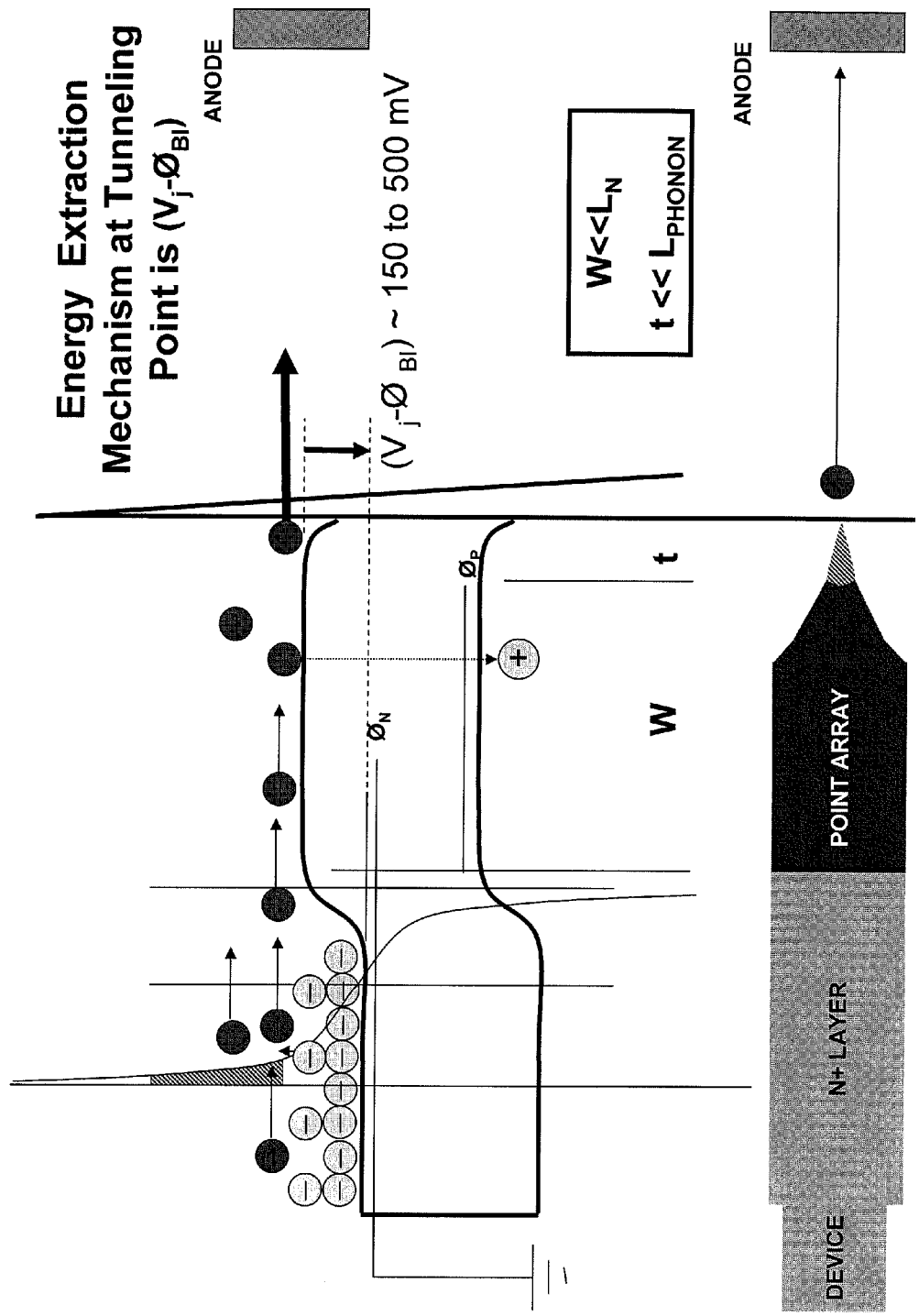
FIG. 5 schematically shows the extraction mechanism according to an embodiment of the disclosure.

FIG. 5 schematically shows the extraction mechanism according to an embodiment of the disclosure. From a theoretical physics stand point study of the energy extraction mechanisms at the tunneling point it is found that using an energy of $(V_{B1}-V_j)$ Volts is most appropriate. The region of operation is about 0.1 to 10 amps/cm$^2$. The current through the thin tips will be carried by diffusing electrons which do not have any significant voltage drop at low level injection conditions (a few kT/q volts). As long as the carrier density of the electron current is below the P doping density of around 8E17 cm$^{-3}$, low level injection conditions should prevail and there should be only a few kT/q's of voltage drop along the point. The saturation velocity $V_{sat}$ in silicon is about 1E7 cm/sec. As long as the current density is less than $qV_{sat}N_a$ doping, where $N_a$ is the doping of the P region, or (1.6E-19)(1E7)(8E17) or 1.25E6 amps/cm$^2$, there should be an adiabatic (lossless) tip transport along its length. In one embodiment, the point current densities is in the range of about 1E5 amps/cm$^2$ max. Accordingly, there will be little or no voltage drop along the point.

A heat balance at the cold side (ignoring heat transfer by radiation) can be written as:

$$Q_{lift} + \frac{K_{wire}A_{wire}}{L_{wire}}(T_{hot} - T_{cold}) + \frac{1}{2}\rho_{e,wire}\frac{L_{wire}}{A_{wire}}I^2 - \alpha_{pc}T_{cold}I = 0 \quad (3)$$

Where $Q_{lift}$ [W] is the load heat flow from the device to be cooled, $K_{wire}$ {Wcm$^{-1}$K$^{-1}$} and $\rho_{e,wire}$ [Ohm-cm], respectively, are the thermal conductivity and electrical resistivity of the cathode side connecting wire (assumed to be constants for this first analysis), $A_{wire}$ [cm$^2$] and $L_{wire}$ [cm] are that wire's cross sectional area and length, I [A] is the electrical current, and $\alpha_{px}$ [V/K] is the effective Seebeck coefficient defined below. A single optimized (e.g. Aluminum) wire will have a length to area ratio:

$$\frac{L_{wire}}{A_{wire}} = \frac{1}{I}\sqrt{\frac{2K_{wire}}{\rho_{e,wire}}(T_{hot} - T_{cold})} \quad [cm^{-1}] \quad (4)$$

This is identical to that of conventional TE cooler legs. The heat balance for a single stage Point Cooler then becomes:

$$Q_{lift} = I(\alpha_{pc}T_{cold} - \sqrt{2K_{wire}\rho_{e,wire}(T_{hot} - T_{cold})}) \quad (5)$$

Refrigerators are compared by evaluating their COP (Coefficient Of Performance) or its inverse the Specific Power. The COP for the Point Cooler is found by dividing the heat lift by the input power:

$$COP_{pc} = \frac{1}{Sp \cdot Power_{pc}} \quad (6)$$

$$= \frac{Q_{lift}}{IV_{anode}}$$

$$= \frac{\alpha_{pc}T_{cold} - \sqrt{2K_{wire}\rho_{e,wire}(T_{hot} - T_{cold})}}{V_{anode}}$$

The best steady state refrigerator possible is that of the Carnot cycle, which has a COP of $T_{cold}/(T_{hot}-T_{cold})$, and it is thus useful to optimize a refrigerator by determining its Second Law Efficiency η, which for the disclosed Point Cooler is:

$$\eta = \frac{COP_{pc}}{COP_{Carnot}} \quad (7)$$

$$= (T_{hot} - T_{cold})\left(\frac{\alpha_{pc}T_{cold} - \sqrt{2K_{wire}\rho_{e,wire}(T_{hot} - T_{cold})}}{T_{cold}V_{anode}}\right).$$

The analysis permits the definition of an equivalent term to the Seebeck coefficient and then a comparison of the Figure Of Merit Z for the Point Cooler disclosed herein.

Figure 6:
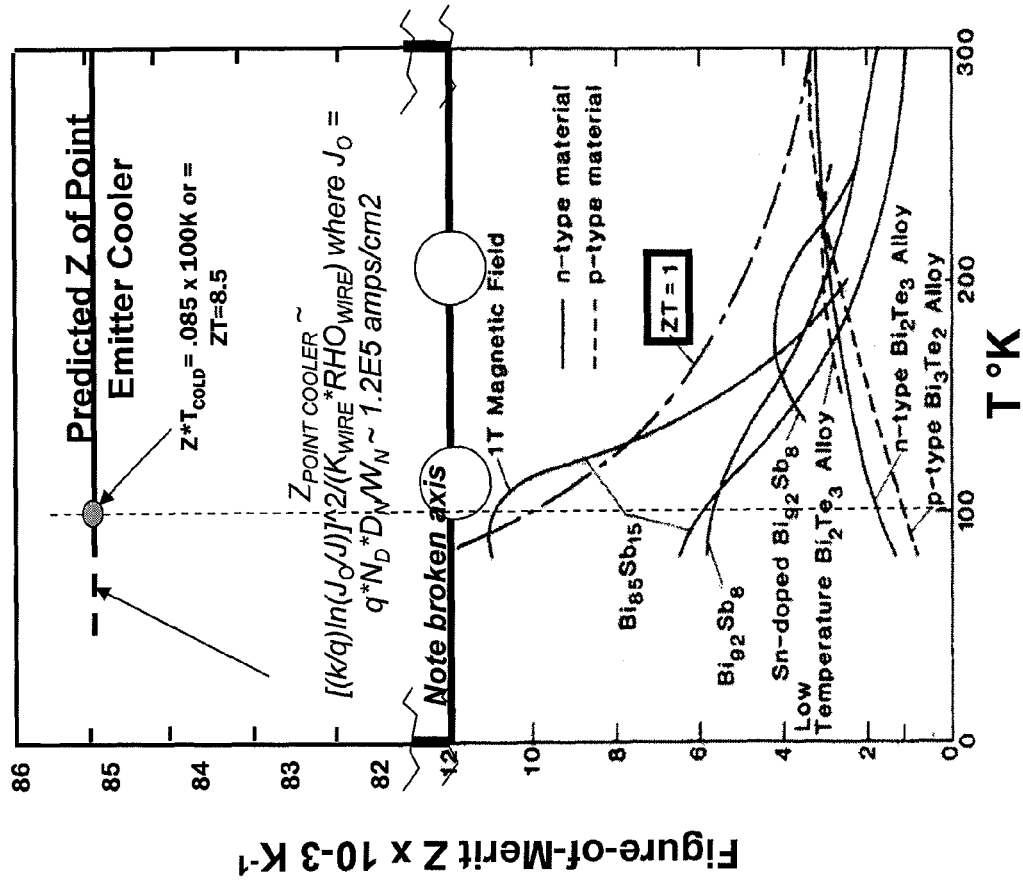
FIG. 6 shows the expected Figure Of Merit for the disclosed point cooler compared to conventional and exotic Peltier materials.

FIG. 6 shows the high predicted values of Figure Of Merit Z for the cooler disclosed herein as contrasted with various thermo-electrics reported experimentally in the literature.

The Figure Of Merit Z [1/K] for a conventional Peltier coolers is provided by:

$$Z_{TE}=2\Delta T_{max}/T^2_{cold}=\alpha^2/(\rho_e\kappa) \quad (8)$$

Where α, $\rho_e$, and κ are, respectively, the Seebeck coefficient [V/K], electrical resistivity [ohm-ccm], and thermal conductivity [W cm$^{-1}$K$^{-1}$]. The comparable Figure of Merit for the disclosed Point Cooler is:

$$Z_{pc}=(\alpha_{pc})^2/(\rho_{w,wire}\kappa_{wire}). \quad (9)$$

The parameter $\alpha_{pc}$ varies slowly with temperature and is given, above, by:

$$\alpha_{pc}=(k/q)\ln(J_o/J) \quad (10)$$

Where $J_o=qN_cD_n/W_p$, and taking the low temperature density of states on the N side as $N_c$=5E18 cm$^{-3}$ around T=90K as representative, and taking $D_n$~30 cm$^2$/sec, and taking $W_p$=2 um (here we use $W_p$ the thickness of the P+ region, instead of $L_p$ since $W_p$ is so much smaller), we get $J_o$=1.2E5 amps/cm$^2$. (Here κ is the Boltzmann constant and q is the electronic charge of 1.6E-19 C.) We notice that $\alpha_{pc}$ varies slowly with temperature since it is logarithmic in both Jo and J.

For J=1 amp/cm$^2$, $\alpha_{pc}$ is (1.38E-23/1.6E-19)(ln(1.2E5/1) of 1.008 millivolts/K~1000 microvolts/K and only slowly varies with temperature when we use $N_c$. Thus:

$$Z_{pc}=(\alpha_{pc})^2/(\rho_{e,wire}\kappa_{wire}) \quad (11)$$

Which for an aluminum wire connection gives, approximately, (1E-3)$^2$/((4E-6)(3)) or ~85E-3/K. At 240K, $Z_{pc}$T=20 and $$\frac{1}{2}Z_{pc}T + 1 = 11.$$

Since $$\frac{1}{2}Z_{pc}T + 1 \approx T_{hot}/T_{cold},$$

the potential for achieving a low $T_{cold}$ for our invention is much greater than the TEs where for the TEs, $$\frac{1}{2}Z_{pc}T + 1 \sim 1.5.$$

Thus, the preferred embodiments a solid state, electronic and vibration free cooler is configured to reach into the 60K temperature range or lower.

In one embodiment, a significant recombination in the P region and on the tip surface are avoided. In another embodiment, the essentially all of the diode junction current due to electrons injected into the P region is kept. Achieving an electron tunnel anode extraction voltage in the 2 to 10 volts range, allows total efficiency which can be competitive with conventional TE coolers. Even at lower Point Cooler efficiency, the ability to deliver a thin lightweight cooler without vibration (i.e., solid state cooler) will most likely have broad insertion advantages over existing larger heavier coolers with their better efficiency.

Figures 7A, 7B:
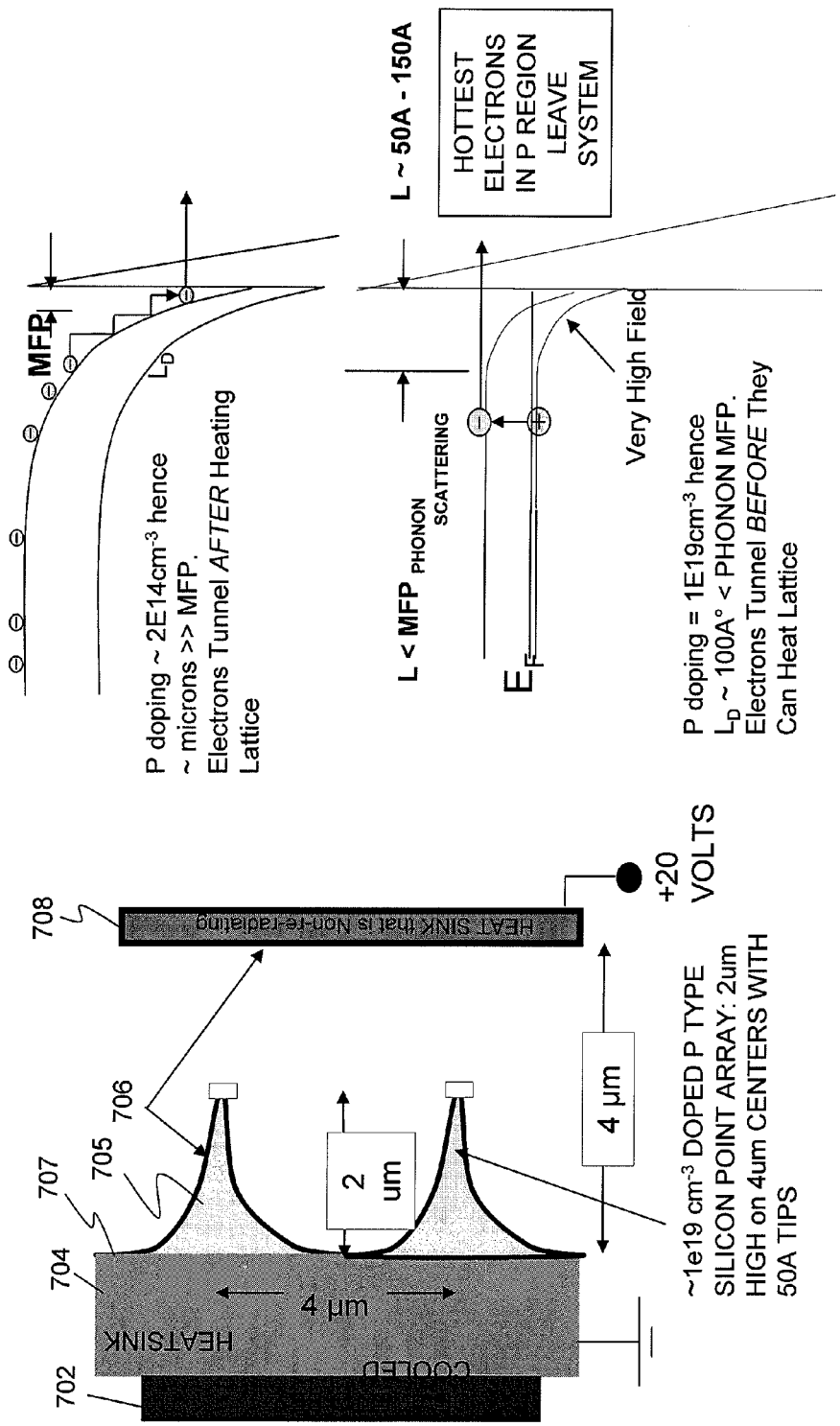
FIG. 7A is a schematic representation of a physical implementation of an embodiment of the disclosure.
FIG. 7B two are band diagrams showing usefulness of high p-type doping for minimizing the depletion depth.

FIG. 7B illustrates the need to keep the P region (which also contains the point electrode) heavily doped. In a conventional experiment, lightly doped P points of approximately 2E14 cm$^{-3}$ were used. The depleted region during tunneling was so thick (about 5 um) that the electrons leaving the P region and entering the depletion region were thermalized by phonon collisions after moving a short distance into the depletion region.

In contrast, the P region of FIG. 7A was doped to approximately 1E18 cm$^{-3}$, where the depletion region at the tip is only about a hundred Å thick. In the experiment representing FIG. 7B, the depletion region was shorter than the phonon mean free scattering path of about 400 Å. Thus, the electrons have a significant probability of tunneling without being thermalized as in the conventional methods.

Thermalized electrons give up their heat energy they pulled from the N++ region, reheating the lattice and nulling the cooling action. This can be avoided by using a heavily doped thin P+ region according to the disclosure. In a preferred embodiment, the P region is about 4 um thick and the Point depletion region about 150 Å thick. The high doping of the P points also greatly increases the field enhancement, allowing a lower anode voltage to achieve the point tip tunnel field to force the electrons to enter the vacuum.

Figure 8:
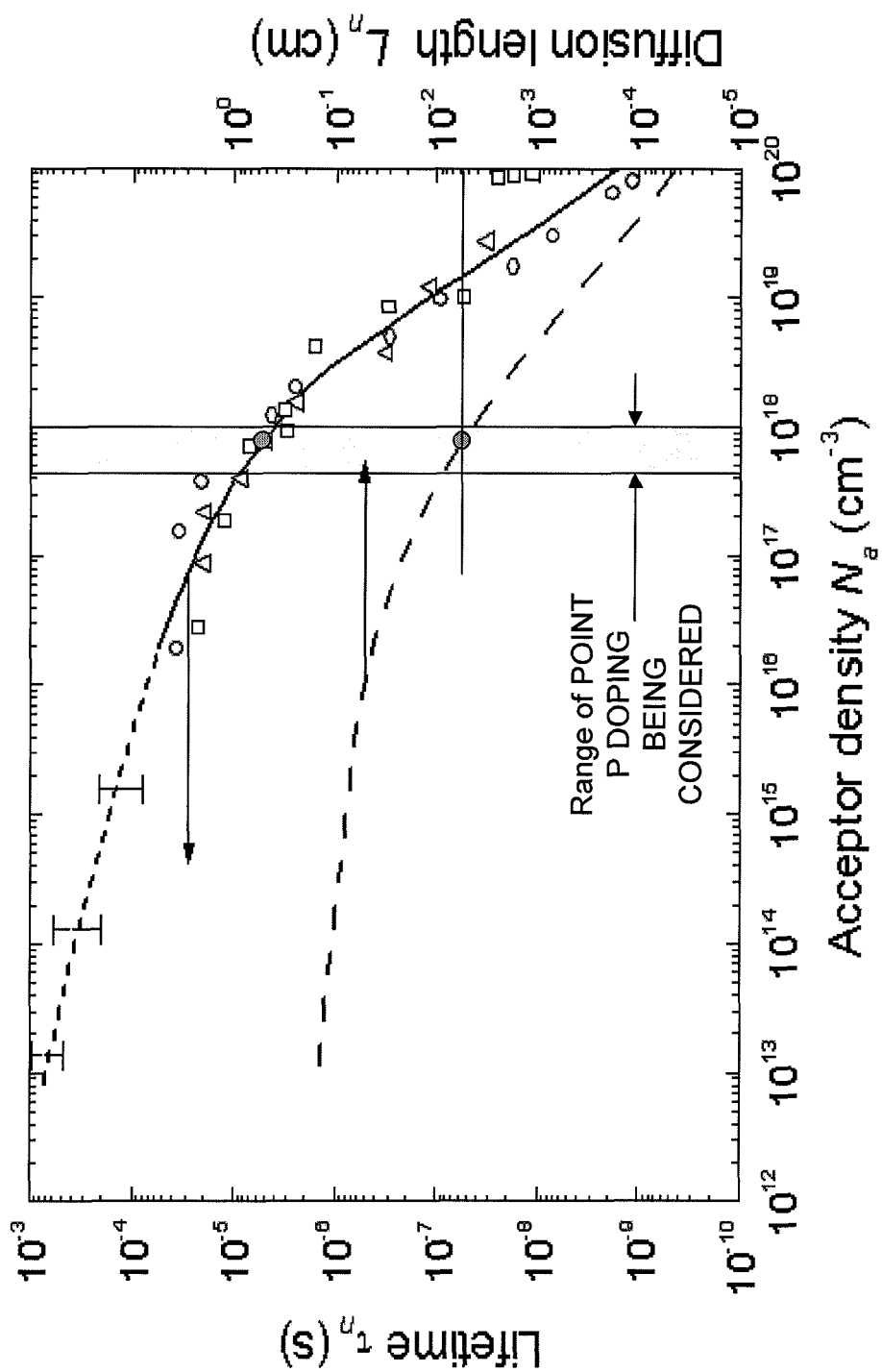
FIG. 8 shows a graph of minority carrier (electron) diffusion length and lifetime in heavily doped p+ material from the Soviet literature.

FIG. 8 shows a graph of diffusion length in heavily doped p+ material from Tyagi, M. S. and R. Van Overstraeten, *Solid State Electron.* 26, 6 (1983) 577-598. In one embodiment of the disclosure, each Point is expected to be about 3 to 4 um high and doped to a p doping of about 1E18 cm$^{-3}$. The depletion region can be less than 140 Å, so that the electrons can get across the depletion region without hitting a phonon (the phonon mean free path is about 400 Å).

It would be expected that with so many holes available at the 1E18 cm$^{-3}$ p-doped point material, the electron lifetime and thus the diffusion length may be severely degraded. FIG. 8 indicates that at 1E18 cm$^{-3}$ p-type, the electron diffusion length of about 70 µm, which is substantially greater than 4 µm, the distance from the pn junction to the emitting tip. This implies that the injected electrons, with their excess energy carrying away the heat from the cold junction, should make it to the edge of the point depletion region without re-combining. That is, the electrons should make it through the point depletion region without giving up their excess energy to the lattice and heating it up.

Figure 9:
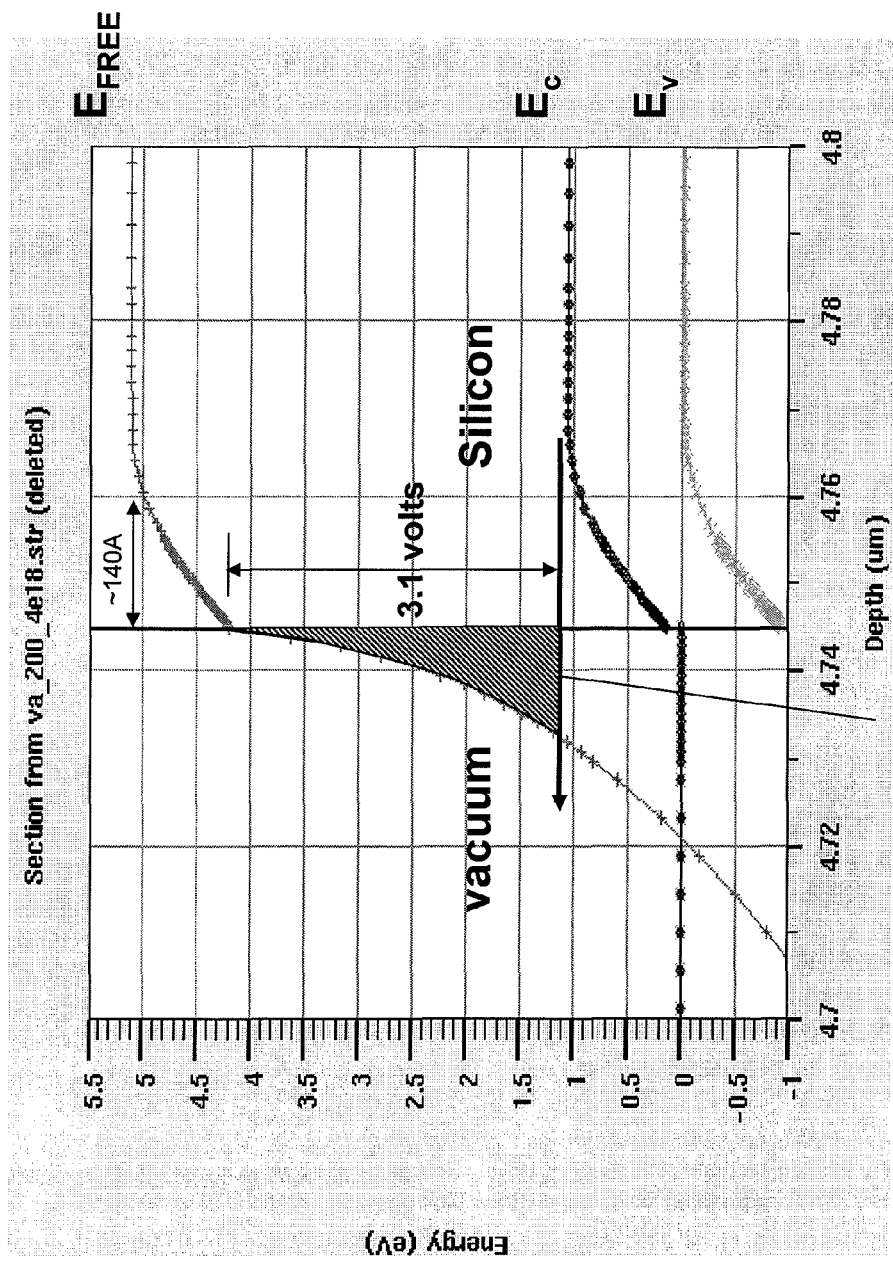
FIG. 9 shows a decrease in the effective tunnel barrier height.

A two dimensional cylindrically symmetric computer calculation of the field and semiconductor barrier situation under the influence of an external field applied to a P+ Point array doped to about 1E18 cm$^{-3}$ is shown in FIG. 9. As seen in FIG. 9, the field intensification occurs near the 50 Å radius tip. The depletion region is about 140 Å thick, which is thin enough to permit the majority of the hotter electrons diffusing from the PN junction to tunnel across the depletion region without suffering a phonon collision. Importantly, it is noted in FIG. 9 that the intense tip field has lowered the voltage between the electron affinity and the conduction band edge from about 4.1 volts to about 3.1 volts, thus increasing the probability of tunneling appreciably.

The tip field associated with an $r_{TIP}$=50 Å is situated about W=2.1 µm from the base of an H=2 µm high point tip 4 µm centerlines is about Electric Tip Field=(V/W)(H/$r_{TIP}$) as known in the art.

The field intensification factor H/$r_{TIP}$=2 um/50 A or about 400. Tunneling calculations indicate an optimal tip field current density of about 500 nA per tip area. Where the tip area is estimated at about 200 Å×200 Å. Thus, the required $J_{TUNNEL}$ is about 1.25E5 amps/cm$^2$.

Assuming a barrier height of about 3.1 volts and an F-N tunnel description of the tunneling, the required external field $V_{ANODE}$/W required to be above current density in a tip of radius 50 A would be about 5E4 volts/cm. Thus, in one embodiment, the anode electrode is placed at a distance of about 2.1 µm from the tip base. The anode voltage is about (E)(W) or (5E4)(2.1E-4) or 10.5 volts, or about 11.5 volts when the voltage drop across the semiconductor of FIG. 9 is included.

Figure 10:
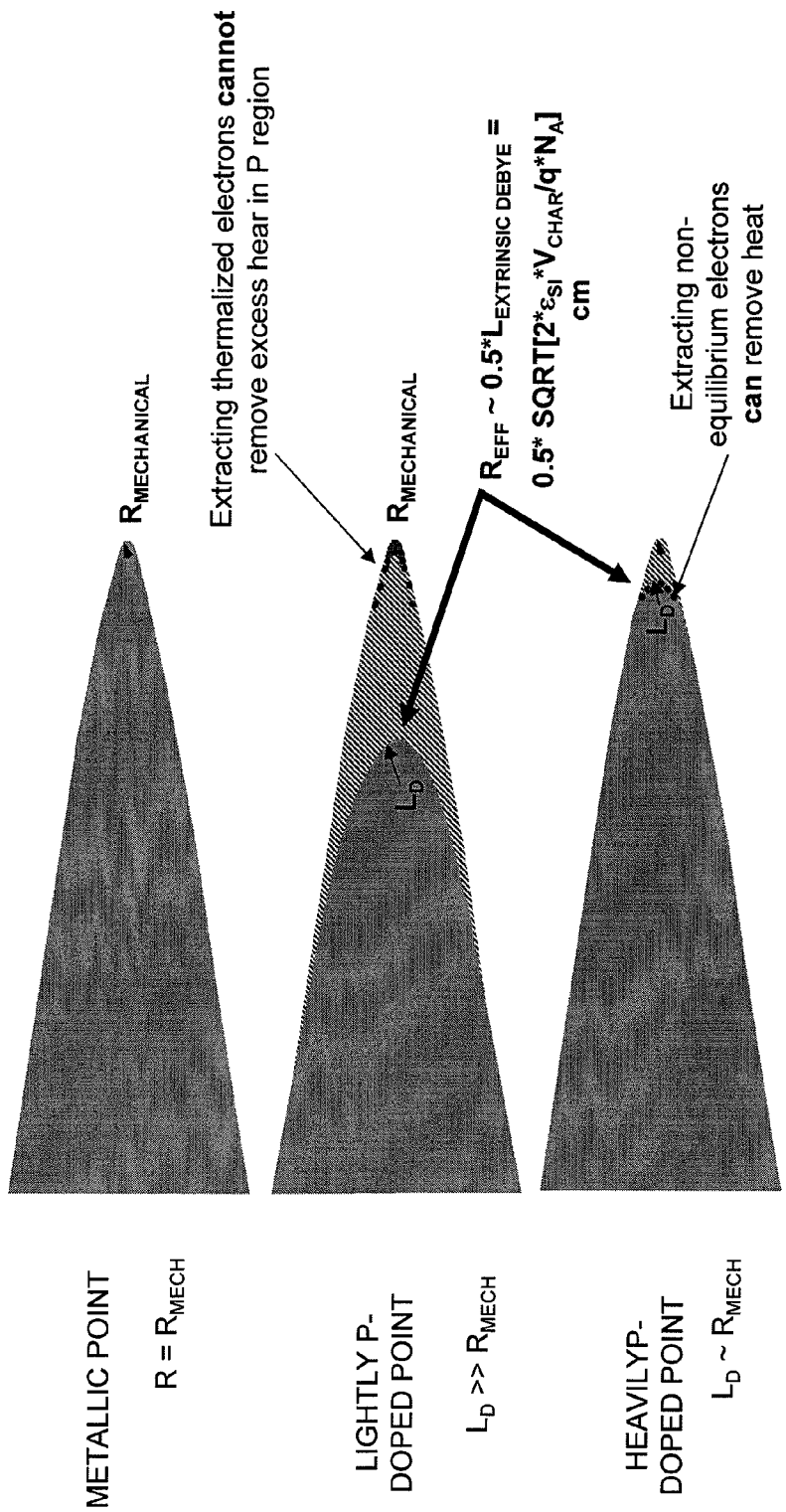
FIG. 10 schematically shows the effect of heavily p-doped points on performance of the cooling system.

FIG. 10 schematically shows the effect of heavily p-doped points on performance of the cooling system. Specifically, FIG. 10 illustrates the importance of having the proper doping of the P+ semiconductor point. If the doping is too high, and the point approaches close to metallic doping (2.5E22 cm$^{-3}$). Metal points are continually re-sharpening themselves and can be unreliable. If the points are too lightly doped, the depletion region is too deep and electrons encounter phonons in their trip across the region, and thermalize, where they are stored at the tip and slowly tunnel but do not cool.

Ideally, the doping is around 1E18 cm$^{-3}$, where not only the depletion region is thin enough, but the radius of the tip is determined in part by the extrinsic Debye Length $L_D$ in the 1E18 cm$^{-3}$ material (50 Å) rather than by the actual mechanical tip radius. This can appreciably increase electron emission uniformity and cooling uniformity since doping uniformity (and therefore $L_D$) is more uniform than mechanical tip uniformity.

Referring once again to FIG. 4, solid state cooling system consists of a vacuum encapsulated cooling element 450 that comprises an electric circuit with first a semiconductor n-p junction (shown as junctions 420 and 440) followed immediately by an array of field emission points 443. The energy flows from Ground 430, through wire 460, through the semiconductor and vacuum 414 to heat sink 464. The potential difference between semiconductor junction 443, which is grounded 430, and heat sink 464, connected to voltage source V+, drives the heat transfer.

Heat is carried away from junction 438 and the heat source by the electrons (not shown) through semiconductor junction 440 and points 443. The electrons are force for the electron propulsion is the potential difference between junction 438 and collection then propelled from points 443, through vacuum 414, to heat sink 405. As discussed, the driving anode 430. The connection anode can be made of copper or other similar metal heat sink configured to convey the heat to the ambient. In the embodiment of FIG. 4, collection anode 430 is connected to bolt 432. Bolt 432 can be coupled to fins or other similar means for quick heat dissipation.

The cooling system of FIG. 4 is configured for use with an IR sensor. As such, cooling system 400 includes lens 442 in thermal communication with the determined by a balance between the heat carried away by the electrons, against the heat brought in by the load device 436 and parasitics incoming heat dues to thermal conduction, Ohmic heating in the lead wire, and thermal radiation losses.

Figure 11:
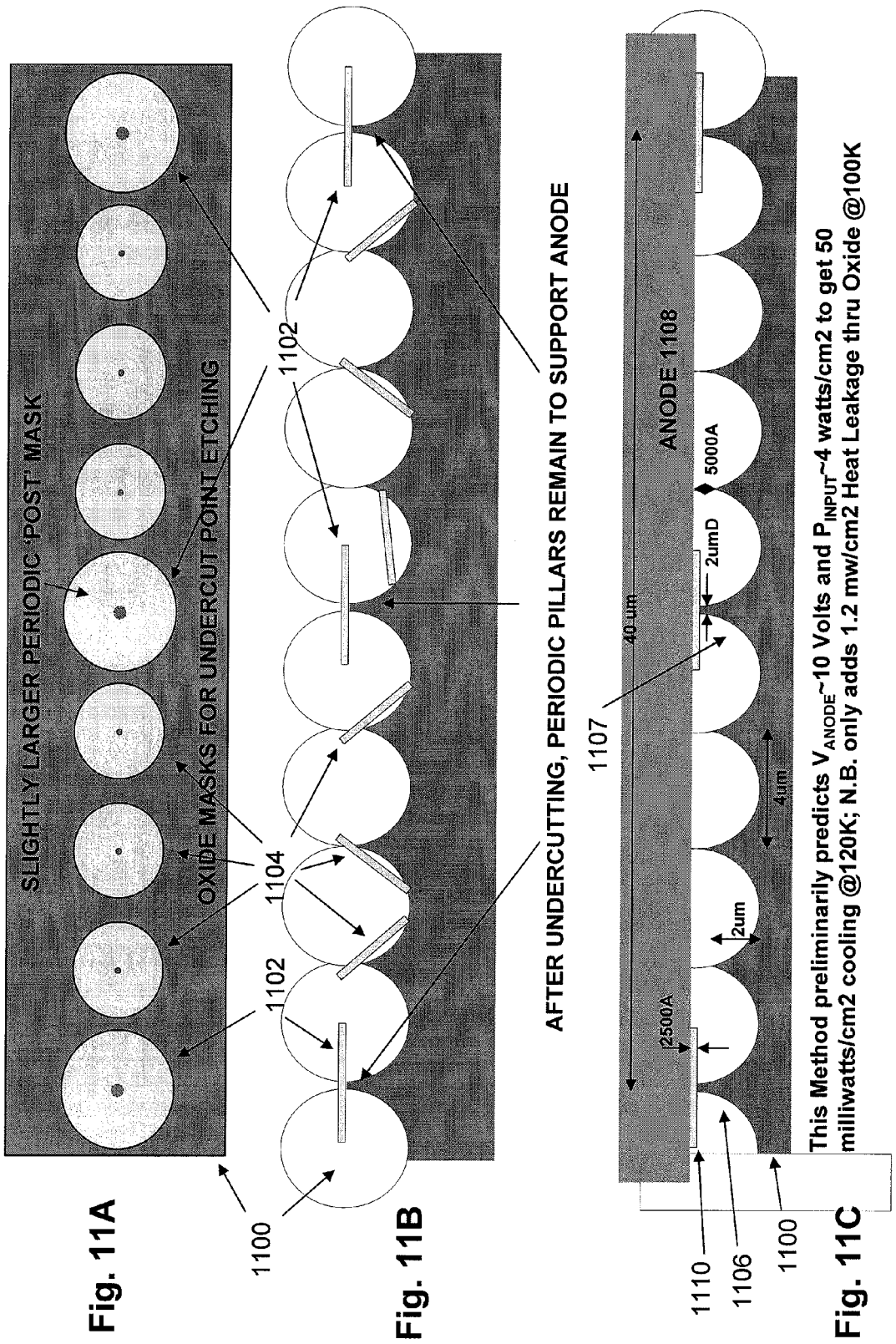
FIGS. 11A-11C schematically show a method for etching point tips.

In one embodiment of the disclosure, points 443 is fabricated by silicon undercut etching in the presence of an array of round oxide masks. FIGS. 11A-11C schematically show a method for etching point tips. Substrate 1100 is etched in a conventional manner using a plurality of masks 1102 and 1104. Masks 1102 are larger in diameter than masks 1104. Masks 1102 have larger inside diameter than masks 1104 thereby providing for pillars 1106, 1108 to be formed. Pillars 1106, 1107 uphold the anode 1108, as shown in FIG. 11C. By way of example, pillar 1107 has an outside diameter of 2 μm. By occasionally widening the oxide diameter (say every 50 oxide circles in both directions), the method of FIG. 11 creates a wider pillar of silicon and the attached oxide 1110 can be used as a spacer to set the gap between the anode and the field emission tips to a very small value. In FIG. 11C, the gap is about 2500 Å.

The oxide provides electrical isolation for these standoff pillars and also minimizes heat leakage due to conduction since silicon oxide is a poor conductor of heat and the silicon pillar is quite narrow. Every 50×50 points with a few thousands angstroms of oxide is sparse enough that the heat leakage across these oxide capped pillars is only a few milliwatts/cm$^2$, much smaller than the cooling capability of the cooler down to 100K or less.

In the instant disclosure, the thermal conduction losses from cathode to anode have been minimized, and the Ohmic/Fourier losses created by the metallic wire attachment of the silicon chip to the negative terminal of the power supply have been optimized. In one embodiment, the re-radiation from the hotter anode back to the cooler PN junction construct can be minimized by coating the anode and point surfaces with gold.

FIG. 7 shows one such implementation. In FIG. 7, device 702 is a heat source and communicates with the proximal end of heat sink 704. Heat sink 704 is grounded. At its distal end, Heat sink 704 also includes an array of tips or points 705. Each tip extends 2 μm from the distal end of heat sink 704. The distance between the distal end of heat sink 704 and non-reradiating heating sink 708 is about 4 μm. The non-reradiating heat sink 708 is coupled to a voltage source of 20 V. The tips 705 are coated with a thin layer of gold 706 as is the outer surface of the non-reradiating heat sink 708.

Coating with gold or other similar material is done to the planar surface of the anode and has a large impact on reducing radiation losses. As shown in FIG. 7, non-electron emitting portions of the silicon chip 707 can also be coated with gold. In one embodiment, the regions around the tip points can be left without coating and as naked silicon. Preferably, such points are not be covered with anything but a very thin layer of SiO$_2$ (<~10 Å) for maximum tunneling effect.

Figure 12:
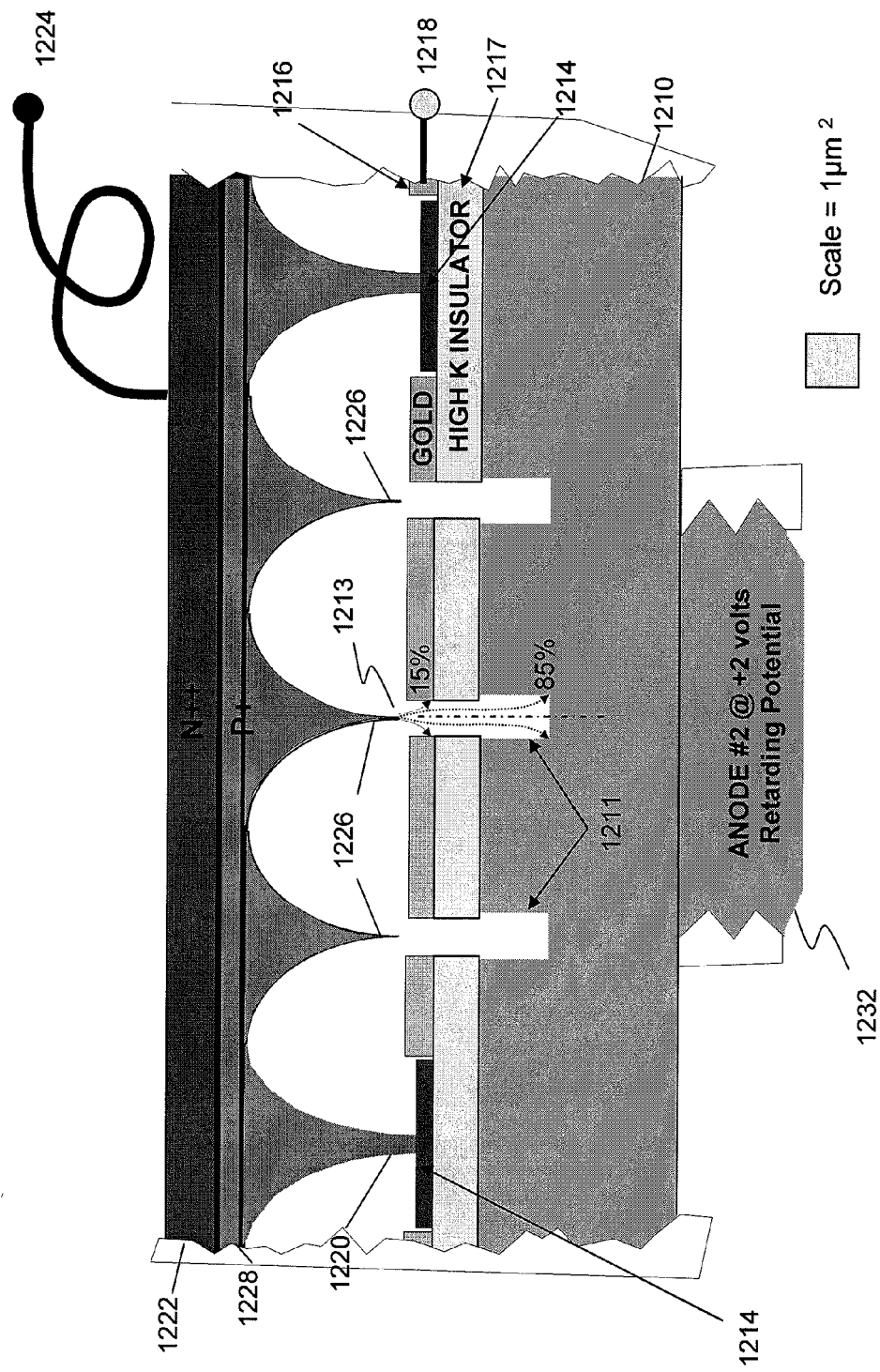
FIG. 12 schematically shows an extraction grid according to one embodiment of the disclosure.

FIG. 12 schematically shows an extraction grid according to one embodiment of the disclosure. The extraction grid is added to further reduce the V$_{ANODE}$. In FIG. 12, heat sink 1210 thermally communicates with anode No. 2, which is at +2 Volts retarding potential. Anode No. 1, marked as 1218, is set at +10 V. Holes 1211 are formed in heat sink 1210 to capture low energy electrons. Insulator layer 1217 can be a conventional insulating material with high insulation constant, K. Gold layer 1216 is positioned over the insulating layer for the reasons discussed above. The PN junction silicon is shown with N++ region 1222 and P+ region 1228. The N++ region is grounded through ground wire 1224. The silicon N++/P+ includes pillars 1220 which were discussed in reference to FIG. 11. The pillars 1220 rest on layers 1214. Layers 1214 can be oxide caps.

The point array tips 1226 are positioned over holes 1211 which act as Faraday cup for collecting low energy electrons. As shown in FIG. 12, approximately 15% of the electrons from point tips 1226 are attracted to gold layer 1216 an the balance is attracted to trenches 1211.

The extraction grid shown in FIG. 12 helps control of the emission current. With a proper design, an extraction grid improves the power efficiency of the cooler. A semi-permeable grid may be used close to the point tips biased at, for example, 10 V to pull the electrons out without diminishing the high required electric field at the tip significantly. A second electrode (a deceleration anode) behind the first semi-permeable grid biased at say 1.5 volts could be configured to capture most of the electrodes. In one embodiment, the opening and the position of the first semi-permeable grid is constructed to capture only 10% of the electrons. With such design, the effective average extraction energy would be lower by about 20% of the dissipative power, which is 10 V in FIG. 12. This corresponds to an effective wall-plug voltage of about 2 V while maintaining the same high extraction field on the point tips and increasing further the application range of the device.

The heat flow and temperature can be controlled by varying the voltage of the grid electrode. If the voltage is controlled based on feedback from a thermal sensor, a "thermal amplifier" results. This creates a heat lift that is inherently operable at a desired set-point, for example, always directed towards the hottest object in the viewing optics (not shown in FIG. 12).

Conventional PN Junction coolers claim a theoretical temperature difference of only about 20° K even when high current densities are applied. The conventional PN junction coolers had a thermal path dominated by thermal conduction in the semiconductor. In contrast, a novel aspect of the disclosure resides in the introduction of a thin metallic wire on the ground side of the junction combined with electron emission into vacuum for heat removal.

As stated, an advantage of TE cooling systems is vibration-free refrigeration. While compact and solid state, the conventional TE cooling systems are only suitable for applications in which cooling temperature do not go below 170° K. The TE materials drop precipitously in their performance for temperatures below this value. While small, TE's do need to be staged to achieve low temperatures. For instance commercial bismuth telluride units require 4 stages of TE cooling to reach 170° K from a 300° K ambient. Due to the need to lift more heat in each stage compared to that stage's lift, the resulting units appear as stepped-pyramids and are too thick to easily insert under existing optical systems. These systems are also relatively fragile. The conventional bismuth telluride compounds cannot take large transverse loadings.

The disclosed point cooling systems are much more robust. In contrast to the conventional TE pyramid, the disclosed cooling systems are on order a fraction of a mm thick and can be F³ ("Form-Fit-Function") inserted into existing optical systems without appreciable optical redesign.

Figure 13A:
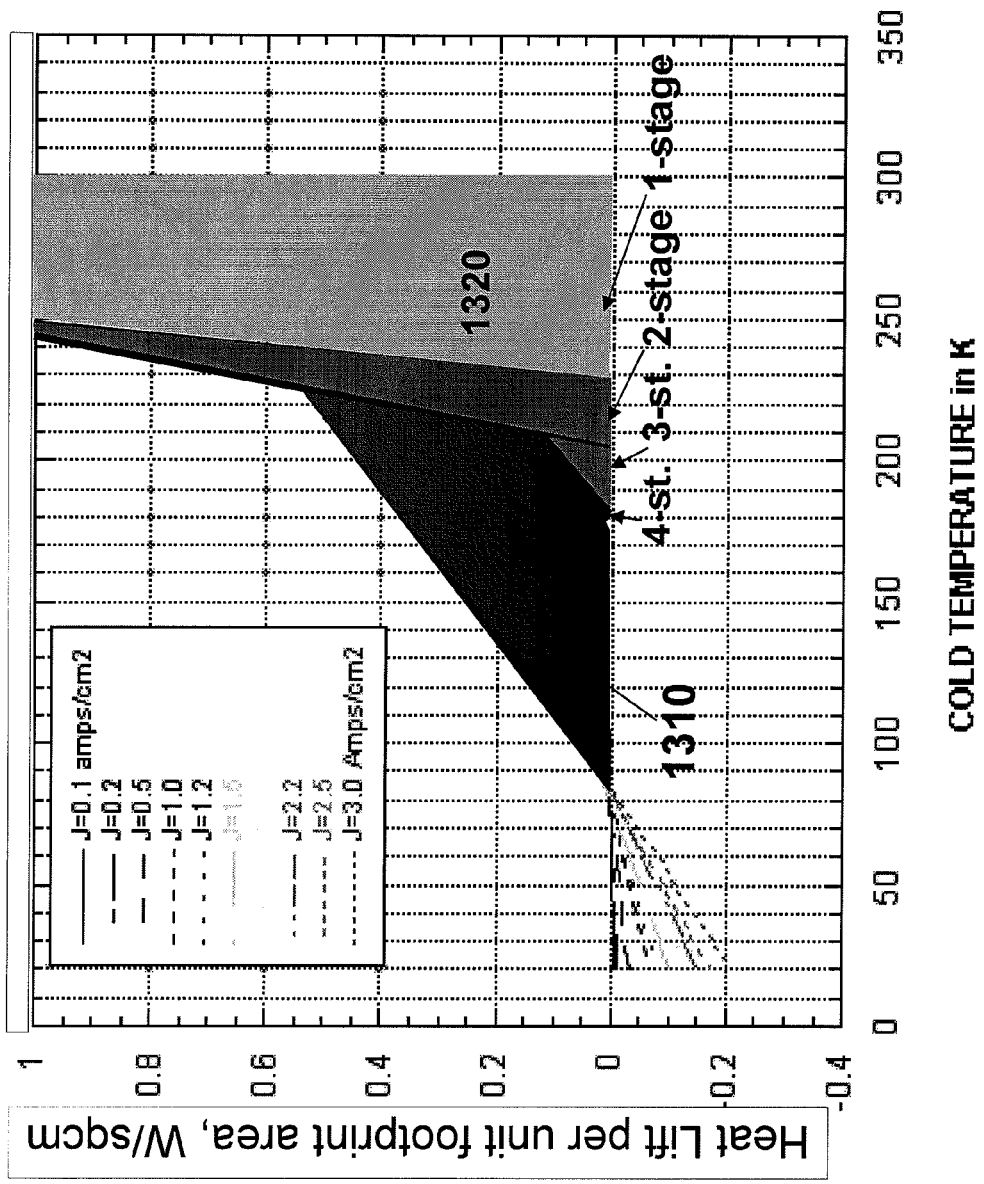
FIG. 13A is a plot comparing the footprint area of commercial TEs against the footprint area of a point cooler according to the disclosed embodiments.

FIG. 13A is a plot comparing the footprint area of commercial TEs against the footprint area of a point cooler according to the disclosed embodiments. In FIG. 13, section 1310 of the graph shows the performance characteristics of the point cooler disclosed herein. Section 1320 of the graph shows the performance characteristics of the conventional TE multistage coolers. It can be seen that point coolers are effective for cooling temperatures below 200° K.

Figure 13B:
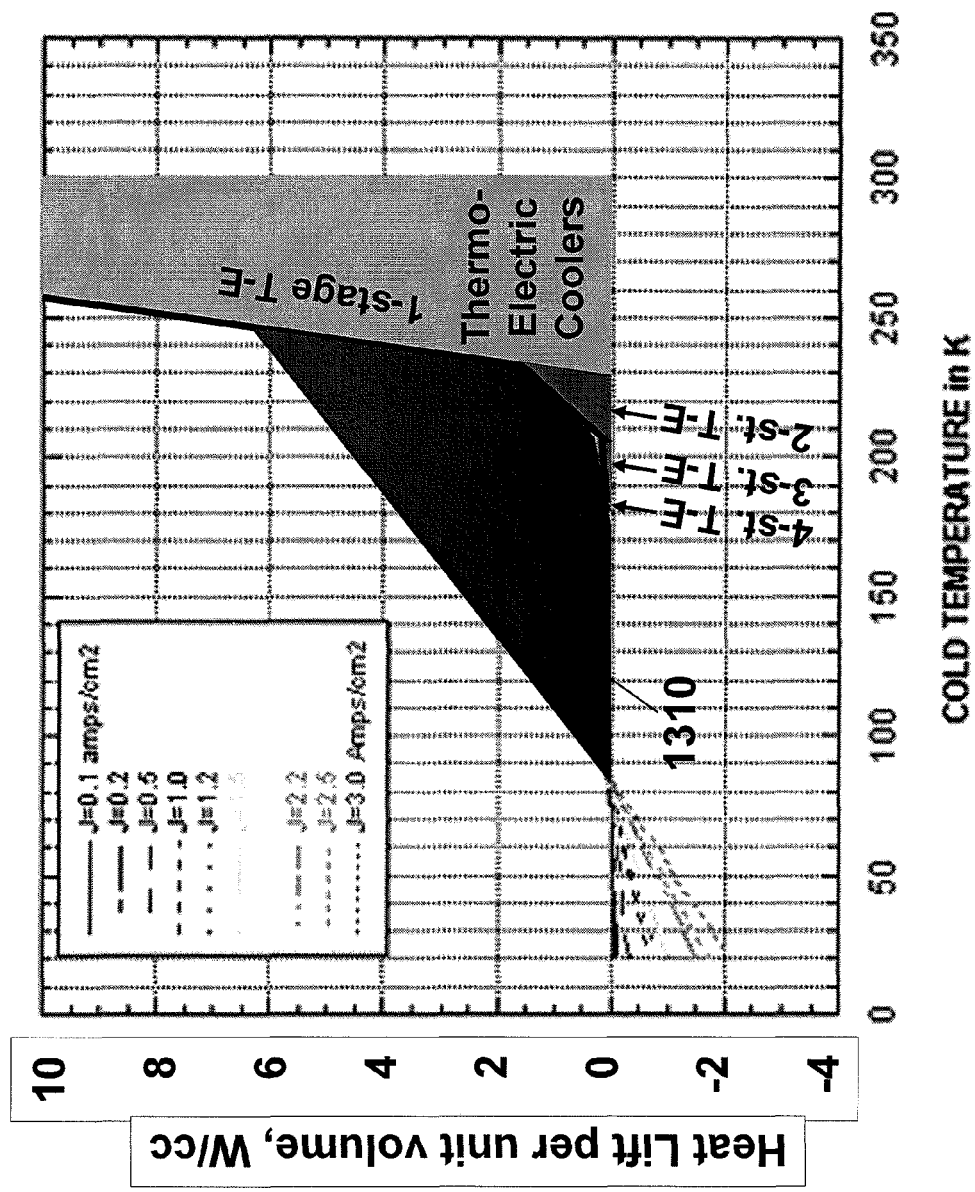
FIG. 13B is a comparison of conventional TE heat lift per unit volume versus the expected values for the disclosed point cooler.

FIG. 13B is a comparison of conventional TE heat lift per unit volume versus the expected values for the disclosed point cooler. It can be seen form FIG. 13B that a point cooler made according to the embodiments disclosed herein outperform conventional TEs for cooling temperatures below 230° K.

Figure 14:
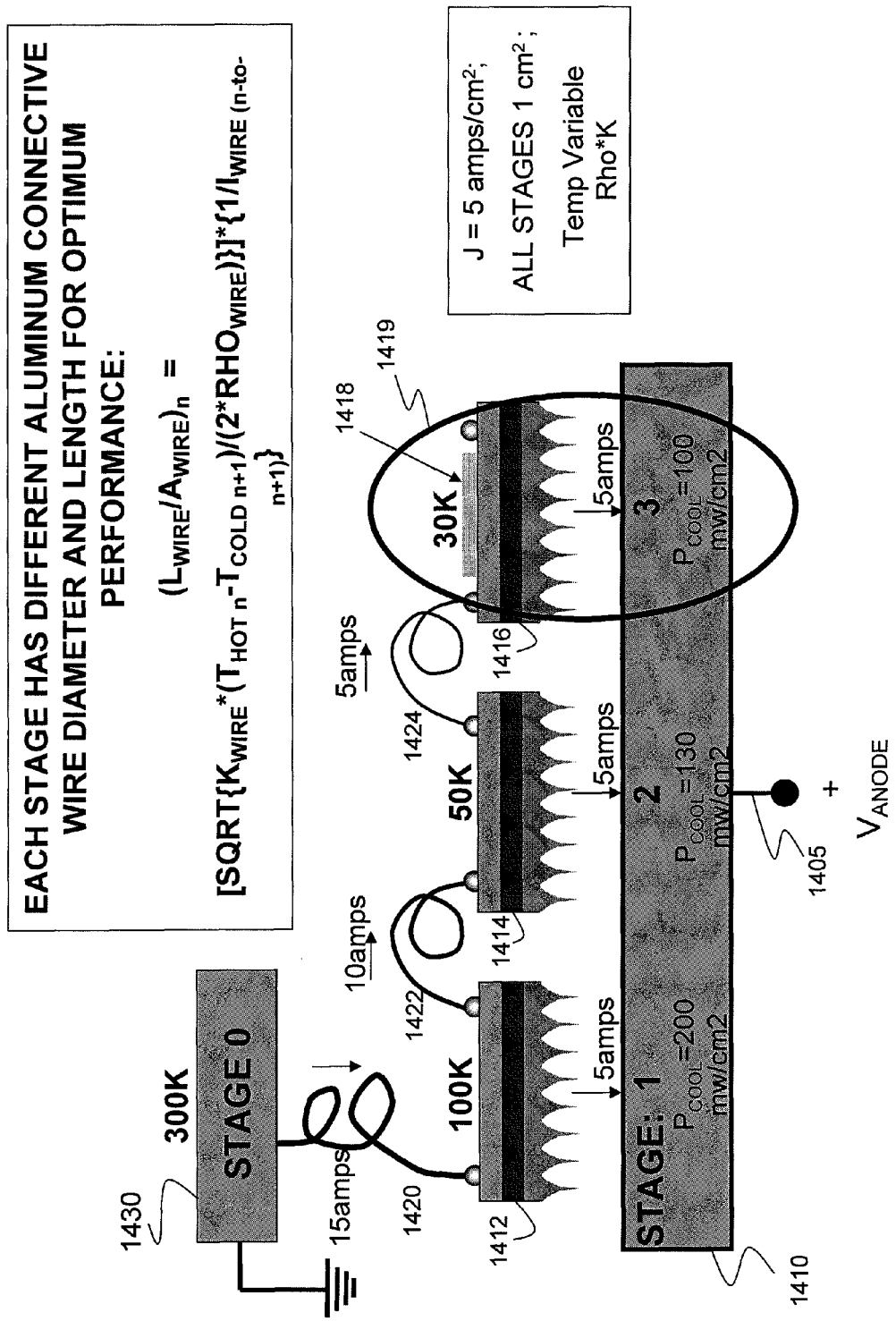
FIG. 14 illustrates a staged point cooler according to an embodiment of the disclosure.

The Point Coolers of the disclosure may be staged to reach colder temperatures. FIG. 14 illustrates a staged point cooler according to an embodiment of the disclosure. Although the cooling system of FIG. 14 is housed in a vacuum housing, for simplicity, the housing and the vacuum are not shown. The cooling system of FIG. 14 comprises anode 1410 connected to voltage source 1405. Anode 1410 includes stages 1, 2 and 3. Each of stages 1, 2 and 3 is positioned across to semiconductor regions 1412, 1414 and 1416, respectively. For example, the third stage 1419 is defined by semiconductor 1418 and appropriate regions P junction 1410.

In the embodiment of FIG. 14, semiconductor regions 1412, 1414 and 1416 are connected in series to region 1430 (Stage 0). Semiconductor region 1430 is grounded. Region 1430 is also in communication with a heat source at 300° K. FIG. 14 shows 15 Amps flowing from Stage 0, through wire 1420, stage 1. The heat flows through point arrays of semiconductor region 1412 according to the principles disclosed herein. The temperature at stage 1 is about 100° K. Of the 15 Amps directed to semiconductor region 1412, about 5 Amps is directed to the anode from Stage 1, carrying with it electrons and heat. The balance, 10 Amps, is transmitted to semiconductor region 1414 through wire 1422. The current flowing through wire 1420 carries electrons and heat between Stage 1 to Stage 2. At stage 2, a similar array point cooling system allows a temperature of 50° K to stage 2 through the point cooling system of Stage 2. A balance of 5 Amps is directed from semiconductor region 1414 to semiconductor region 1416 through wire 1424.

Target to be cooled 1418 is placed over semiconductor region 1416. Stage 3 of the cooling system of FIG. 14 operates in a similar manner to the previous stages and removes the balance of the heat from semiconductor region 1416 to P junction 1410. Electrons from P junction 1410 flow to voltage source 1405 ($V_{Anode}$) thereby dissipating the heat.

The size, type and diameter of wires 1420, 1422 and 1424 can be selected according to design criteria and to control the heat/electrical conductivity.

In the conventional staged cooling system which use a pyramid cooling scheme, each latter stage must reject its heat to the next hotter stage, which creates an expanding pyramid stack up, since each stage must handle ever more heat flow. However, each stage in the embodiment of FIG. 14 can send its current flow through the vacuum directly to the hot stage. Thus heat rejection is accomplished in parallel, while the parasitic Fourier and Ohmic losses can be configured in series at the cold stages. This is shown schematically in FIG. 14, which depicts two guard point coolers that drop the temperature from ambient down to first a nominal 100K, and then to a nominal 50K. The cooler deals with parasitics losses. The final cold stage, shown at a nominal 30K, must lift the load and parasitic losses of being connected to a 50K heat sink. This configuration is significantly more robust than conventional pyramidal TEs.

Figure 15:
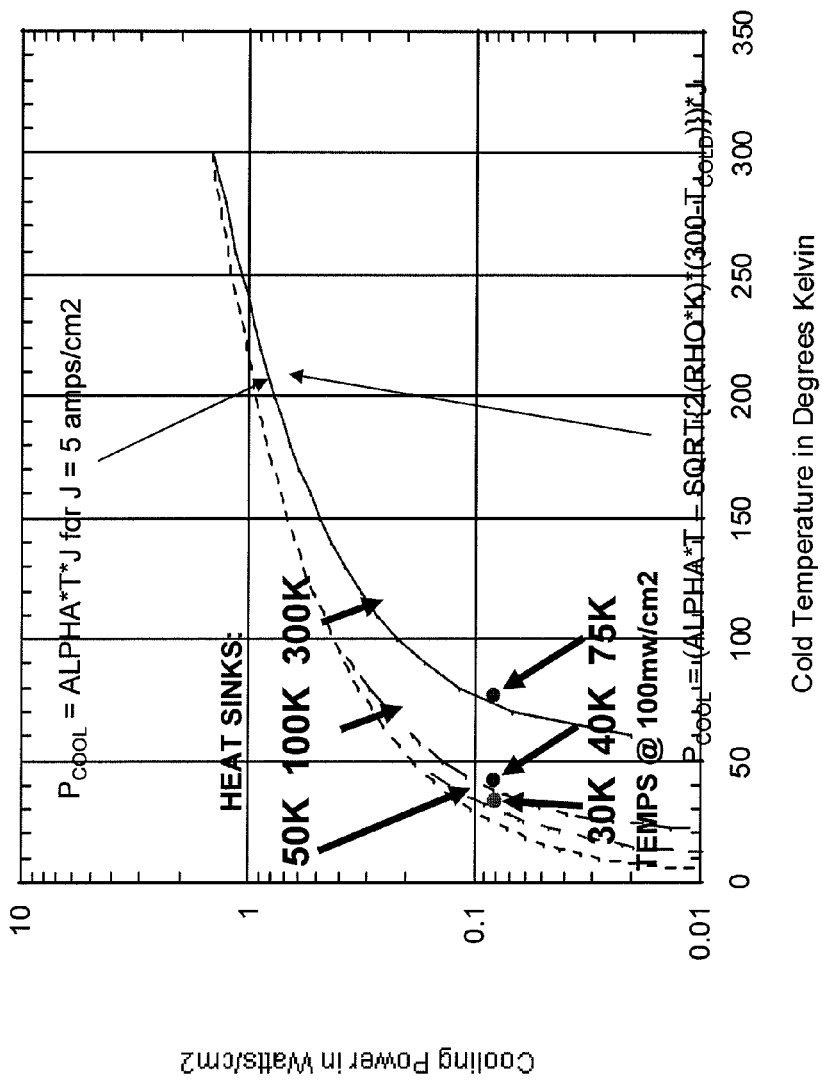
FIG. 15 shows calculated cooling curves for the three-stage cooling system of FIG. 14.

FIG. 15 shows calculated cooling curves for the three-stage cooling system of FIG. 14. Specifically, FIG. 15 is a computer simulation of a non-optimized three-stage point-cooling system. The simulation of FIG. 15 does not account for the very low temperature effects in silicon such as impurity deionization. It is also noted that 300° K back radiation from gold layer is only about 1.03 mW/cm² at 30° K.

The cooling systems disclosed herein compare well against reverse heat engine refrigerators in terms of weight and cost. A recent survey of cryogenic coolers examined more than 250 cryogenic coolers. For the smallest coolers, those with heat lift capacities below 2 W, the least expensive was $4,500 (in quantities of 100 or more), and the lightest 0.45 kg in weight. The disclosed cooling systems can be fabricated in a silicon IC process foundry and can have a potential cost 100 to 1000 times less. In addition, the component weight is about 100 times less than conventional heat engine systems.

In one embodiment of the disclosure, a pre-cooler is used with the point-cooler systems disclosed. For example, a conventional TE may be used as the initial guard cooler to drop the temperature from ambient down to the next stage temperature, utilizing the regime where TEs perform at their highest efficiency and then continuing cooling with the point cooling methodology disclosed herein.

The disclosed point cooler systems require no thermal generation of electrons, nor is there a need for a secondary process (such as hopping) to provide the source of minority carriers inversion layer such as is required in Inverse Nottingham cooling, discussed earlier in [00051]. The electron back injecting contact floods the points with minority carriers where the p region thickness $W_p \ll L_e^p$, where $L_e^p$ is the diffusion length of electrons in the p material (FIG. 8).

In another embodiment, the tip depletion region thickness $W_d \ll L_{phonon}$, and electrons leave carrying the original heat content taken remotely from the N+/P junction. The heat carried by the electrons is injected into the vacuum and ultimately the anode region of the solid state device.

Figure 16:
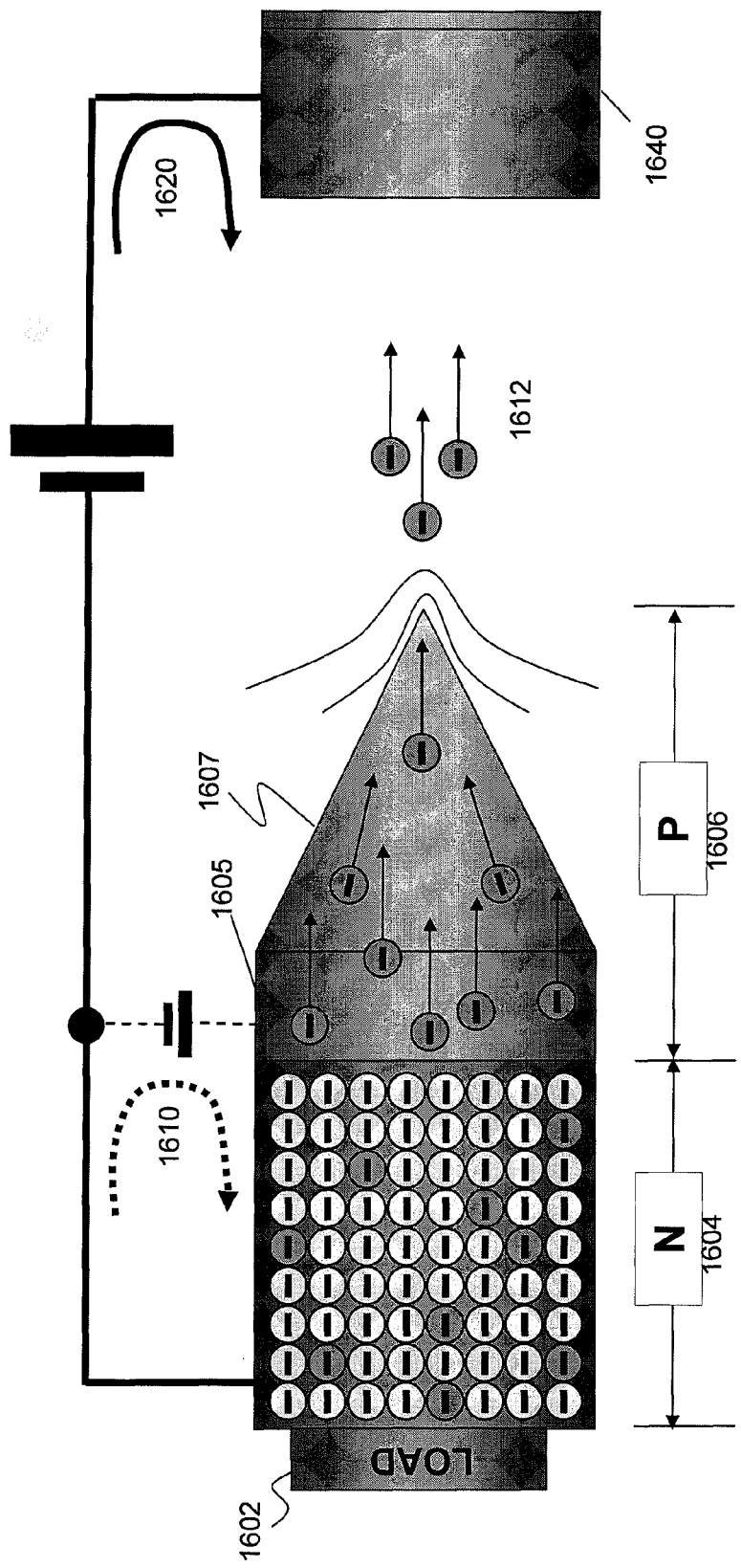
FIG. 16 is a schematic representation of an embodiment of the disclosure.

FIG. 16 is a schematic representation of an embodiment of the disclosure. The system shown in FIG. 16 has circuits 1610 and 1620. The load 1602 is placed at the distal end of the semiconductor region 1604. Semiconductor region 1604 defines an N-doped region and is coupled to the P-doped region 1606 at its proximal end. The P-doped region 1606 includes a first portion 1605 and a second portion 1607. The first portion 1605 and the distal end of semiconductor region 1604 form first circuit 1610. The distal end of semiconductor region 1604 and anode heat sink 1640 define second circuit 1620.

The current in the first circuit is shown by broken arrow 1610. Given the polarity of circuit 1610, electrons and holes flow from the distal end to the proximal end of N-doped region 1604. The electrons and holes are thermalized as they carry heat away from load 1602. First circuit 1610 propels electrons toward first portion 1605 of P-doped region 1606. As thermalized electrons enter first portion 1605, second circuit 1620 influences and directs their migration to second portion 1607. Second portion 1607 is a pointed tip in the representative embodiment of FIG. 16. While not shown, the entire system of FIG. 16 can be placed in a vacuum chamber.

The vacuum tunneling effect coupled with second circuit 1620 propels electrons from second portion 1607 of P-doped region 1606 to anode heat sink 1640. Consequently, heat is removed form the pointed tip of P-doped region 1606, and ultimately from load 1602, to heat sink 1640. In the embodiment of FIG. 16, first circuit 1610 injects many electrons from the N-doped region to the P-doped region, each of which carries heat away from the N-doped region 1604, thus cooling the target device. Circuit 1620 creates a high field at the pointed tip of P-doped region 1606, allowing heated electrons 1612 to tunnel without heat loss into vacuum (not shown) and carry heat to anode heat sink 1640. It should be noted that while the embodiment of FIG. 16 shows only one point-cooling device, the principles disclosed herein apply to devices having an array of point-cooling tips.

While the specification has been disclosed in relation to the exemplary embodiments provided herein, it is noted that the inventive principles are not limited to these embodiments and include other permutations and deviations without departing from the spirit of the disclosure.

We claim:

1. A heat transfer device comprising:
a semiconductor material having a first region and a second region, the first region and the second region doped to propel a charged carrier from the first region to the second region;
an array of pointed tips thermoelectrically communicating with the second region;
a heat sink facing the array,
a vacuum tunneling region formed between the pointed tips and the heat sink; and
a power source for biasing the heat sink with respect to the first region;
wherein the first region defines an N-type semiconductor material and the second region defines a P-type semiconductor material.

2. The heat transfer device of claim 1,
wherein the power source comprises:
a first positive terminal coupled to the heat sink;
a second positive terminal coupled to the second region of the semiconductor material; and
one of a neutral and a negative terminal coupled to the first region of the semiconductor material;
wherein the first and second regions of the semiconductor material are forward biased to propel a carrier from the first region of the semiconductor material through the second region of the semiconductor material and to the heat sink due to forward biasing of the first and second regions of the semiconductor material.

3. The heat transfer device of claim 1, wherein the pointed tips are cylindrical and are symmetrically arranged within the array.

4. The heat transfer device of claim 2, wherein the first region of the semiconductor material is coupled to the one of the neutral and negative terminal of the power source via a wire comprising aluminum.

5. The heat transfer device of claim 1, wherein distance between a given pointed tip of the array of pointed tips and the hot sink is in the range of about 2 nm to 50 microns.

6. The heat transfer device of claim 1, wherein voltage difference between the first region and the heat sink is about 20-60 V.

7. The heat transfer device of claim 1, wherein the first and second regions of the semiconductor material interface at a PN homojunction.

8. The heat transfer device of claim 1, wherein the array of pointed tips and the heat sink are gold plated.

9. The heat transfer device of claim 1, wherein the first region includes N++ doping and the second region includes P+ doping.

10. The heat transfer device of claim 9, wherein the array of pointed tips includes P++ doping.

11. The heat transfer device of claim 1, wherein the heat sink further comprises an insulator layer and a gold layer.

12. A heat transfer device, comprising:
an N-type region of a silicon semiconductor material;
a P-type region of the silicon semiconductor material in contact with the N-type region of the silicon semiconductor material at a PN junction, the P-type region of the silicon semiconductor material having a plurality of pointed tips spaced apart from the N-type region of the silicon semiconductor material;
a hot sink facing the plurality of pointed tips, wherein a vacuum separates the plurality of pointed tips of the P-type region of the silicon semiconductor material and the hot sink; and
a power source coupled to the silicon semiconductor material to forward bias the N-type and P-type regions of the silicon semiconductor material, thereby propelling carriers from the N-type region of the silicon semiconductor material through the P-type region of the silicon semiconductor material and to the heat sink.

13. The heat transfer device of claim 12, wherein the power source is coupled to the N-type region of the silicon semiconductor material via a wire with a thermal conductivity times electrical conductivity of about 0.1 to 10 Watts micro-Ohm per degree Kelvin.

14. The heat transfer device of claim 12, wherein the N-type region of the silicon semiconductor material includes N++ doping and the P-type region of the silicon semiconductor material includes P+ doping, such that the PN junction comprises a N++ and P+ interface.

15. The heat transfer device of claim 12, wherein the plurality of pointed tips include P++ doping.

16. The heat transfer device of claim 12, further comprising a load thermoelectrically coupled to the N-type region of the silicon semiconductor material, such that a temperature of the load is reduced.

17. The heat transfer device of claim 12, wherein the power source comprises:
a first positive terminal coupled to the heat sink;
a second positive terminal coupled to the P-type region of the silicon semiconductor material; and
one of a neutral and a negative terminal coupled to the N-type region of the silicon semiconductor material;
wherein the carriers propelled through the P-type region of the silicon semiconductor material are minority carriers.

18. A heat transfer transistor comprising:
an N-doped region of a semiconductor material;
a heat sink;
a P-doped region of the semiconductor material, the P-doped region of the semiconductor material interposed between the N-doped region of the semiconductor material and the heat sink, the P-doped region of the semiconductor material thermoelectrically communicating with the N-doped region of the semiconductor material at a PN junction and the P-doped region of the semiconductor material having an array of pointed tips;
a vacuum region extending from the array of pointed tips to the heat sink; and
power supply configured to forward bias the N-doped and P-doped regions of semiconductor material.

19. The heat transfer transistor of claim 18, wherein the N-doped region of the semiconductor material is heavily doped and the P-doped region of the semiconductor material is lightly doped in a sub-region of the P-doped region of semiconductor material proximal to the PN junction.

20. The heat transfer transistor of claim 18, wherein the P-doped region of the semiconductor material is heavily doped in a sub-region of the P-doped region of semiconductor material proximal to the array of pointed tips and distal to the PN junction.

21. The heat transfer transistor of claim 18, wherein the heat sink and at least a region of each of the array of pointed tips are gold plated.

22. The heat transfer transistor of claim 18, further comprising a voltage difference between the N-doped region of the semiconductor material and the P-doped region of the semiconductor material in the range of about 0.5-1.0 V.

23. The heat transfer transistor of claim 18, further comprising a voltage difference between the N-doped region of the semiconductor material and the heat sink in the range of about 2-200 V.

24. A method for cryogenically cooling a node, the method comprising:
thermoelectrically transferring heat from the node to a semiconductor material having an N-doped region and a P-doped region, wherein the N-doped and P-doped regions of the semiconductor material interface at a PN homojunction; and
biasing the semiconductor material with respect to a heat sink to provide movement for a charged carrier from the N-doped region of the semiconductor material, through the P-doped region of the semiconductor material, across a vacuum region and to the heat sink.

25. The method of claim 24, wherein the semiconductor material is biased by a power source coupled to the N-doped region of the semiconductor material via a wire with a thermal conductivity times electrical conductivity of about 0.1 to 10 Watts micro-Ohm per degree Kelvin.

26. The method of claim 24, wherein the semiconductor material comprises silicon.

27. The method of claim 26, wherein the P-doped region of the semiconductor material includes an array of pointed tips.

28. The heat transfer device of claim 1, wherein the semiconductor material comprises silicon with an electron lifetime of at least 0.1 microseconds.

29. The heat transfer device of claim 2, wherein the first region of the semiconductor material is coupled to the one of the neutral and negative terminal of the power source via a wire comprising a material with a thermal conductivity times electrical conductivity of about 0.1 to 10 Watts micro-Ohms per degree Kelvin.

30. The heat transfer device of claim 29, wherein the second region of the semiconductor material is coupled to the second positive terminal of the power source via a wire comprising a material with a thermal conductivity times electrical conductivity of about 0.1 to 10 Watts micro-Ohms per degree Kelvin.

31. The heat transfer device of claim 29, wherein the wire has a length to cross sectional area ratio selected to substantially minimize heat return, the length to cross sectional area ration being substantially equal to:

$$L_{wire}/A_{wire} = 1/I\sqrt{2K_{wire}\tau_{e,wire}(T_{hot}-T_{cold})}[cm^{-1}],$$

wherein:
$L_{wire}$ is the length of the wire;
$A_{wire}$ is the cross sectional area of the wire;
I is the current through the wire;
$K_{wire}$ is the thermal conductivity of the wire;
$\rho_{e,wire}$ is the electrical resistivity of the wire;
$T_{hot}$ is the temperature at a hot side of the wire; and
$T_{cold}$ is the temperature at a cold side of the wire.

32. The heat transfer device of claim 1, wherein the array of pointed tips are covered with a film with a thermal radiation emissivity of about 0.1.

33. The heat transfer transistor of claim 18, wherein the power source is coupled to the N-type region of the silicon semiconductor material via a wire with a thermal conductivity times electrical conductivity wire in a range of about 0.1 to 10 Watts micro-Ohms per degree Kelvin.

34. The heat transfer transistor of claim 18 wherein the power source is coupled to the N-type and P-type regions of the silicon semiconductor material via wires with a thermal conductivity times electrical conductivity wire in the range of 0.1 to 10 Watts micro-Ohms per degree Kelvin.

35. The heat transfer transistor of claim 18, wherein the semiconductor material comprises silicon, and the PN junction of the semiconductor material comprises a PN homojunction.

36. The heat transfer transistor of claim 35, wherein the P-type region of the semiconductor material is continuous over the N-type region of the semiconductor material.

37. The method of claim 25, wherein the semiconductor material is forward biased by a power source coupled to the N-doped region of the semiconductor material via a wire with a thermal conductivity times electrical conductivity in the range of about 0.1 to 10 Watts micro-Ohms per degree Kelvin.

38. A heat transfer device comprising:
a single silicon crystal comprising:
an N-type layer; and
a lightly doped P-type layer having an outer surface formed into an array of sharp P-type points, wherein the N-type layer and the lightly doped P-type layer form a PN homojunction;
a power source forward biasing the N-type and lightly doped P-type layers of the single silicon crystal to propel electrons from the N-type layer to the lightly doped P-type layer of the single silicon crystal; and
an anode metallic sheet layer spaced apart from the pointed tips on the P-type layer of the single silicon crystal by a high vacuum region, wherein the anode metallic sheet layer is positively biased to attract electrons injected by the N-type region of the single silicon crystal into the lightly doped P-type layer of the single silicon crystal, such that electrons migrate to the array of sharp P-type points of the single silicon crystal and emerge into the high vacuum region thereby transferring heat from a load thermally coupled to the N-type layer of the single silicon crystal to the anode metallic sheet layer.

39. The heat transfer device of claim 36, further comprising two purely metallic wires connecting the power source and the N-type and lightly doped P-type layers of the single silicon, the pure metallic wires having a selected length and cross sectional area to minimize return heat to the single silicon crystal during biasing.

* * * * *